United States Patent
Jung et al.

(10) Patent No.: US 11,126,029 B2
(45) Date of Patent: Sep. 21, 2021

(54) OPTICAL MEMBER AND DISPLAY DEVICE INCLUDING THE SAME

(71) Applicant: SAMSUNG DISPLAY CO., LTD., Yongin-si (KR)

(72) Inventors: Jin-soo Jung, Hwaseong-si (KR); Younggu Kim, Yongin-si (KR); Taekjoon Lee, Hwaseong-si (KR); Jongmin Ok, Hwaseong-si (KR); Sun-young Chang, Seoul (KR); Hyelim Jang, Hwaseong-si (KR); Baekkyun Jeon, Yongin-si (KR); Kyungseon Tak, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/439,041

(22) Filed: Jun. 12, 2019

(65) Prior Publication Data

US 2020/0073169 A1 Mar. 5, 2020

(30) Foreign Application Priority Data

Sep. 3, 2018 (KR) .......... 10-2018-0104506

(51) Int. Cl.
| | |
|---|---|
| *G02F 1/1335* | (2006.01) |
| *H01L 27/32* | (2006.01) |
| *G02F 1/1368* | (2006.01) |
| *G02F 1/1343* | (2006.01) |
| *G02F 1/13357* | (2006.01) |

(52) U.S. Cl.
CPC ...... *G02F 1/133514* (2013.01); *G02F 1/1368* (2013.01); *G02F 1/133617* (2013.01); *G02F 1/134309* (2013.01); *H01L 27/322* (2013.01); *H01L 27/3232* (2013.01); *H01L 27/3244* (2013.01); *G02F 2202/36* (2013.01)

(58) Field of Classification Search
CPC ......... G02F 1/133502; G02F 1/133514; G02F 1/133504
See application file for complete search history.

(56) References Cited

U.S. PATENT DOCUMENTS

| | | | |
|---|---|---|---|
| 10,078,170 B2 | 9/2018 | Kim et al. | |
| 10,126,587 B2 | 11/2018 | Chung | |
| 10,739,502 B2 | 8/2020 | Baek et al. | |
| 2005/0030444 A1 | 2/2005 | Fujiwara et al. | |
| 2013/0222916 A1* | 8/2013 | Ogane ................ | C09D 7/61 359/601 |
| 2017/0031205 A1* | 2/2017 | Lee ................ | G02F 1/133621 |
| 2017/0131439 A1* | 5/2017 | Kobori ................ | G02B 1/118 |

(Continued)

FOREIGN PATENT DOCUMENTS

| | | |
|---|---|---|
| CN | 106405918 A | 2/2017 |
| CN | 106547136 A | 3/2017 |

(Continued)

*Primary Examiner* — Jessica M Merlin
(74) *Attorney, Agent, or Firm* — Lewis Roca Rothgerber Christie LLP

(57) ABSTRACT

Provided is an optical member. The optical member includes a color filter member including quantum dots and a low-refractive index layer below the color filter member and including a first hollow particle and a second hollow particle. The first hollow particle may have a particle size different from a particle size of the second hollow particle.

9 Claims, 12 Drawing Sheets

(56) References Cited

U.S. PATENT DOCUMENTS

2018/0299727 A1 10/2018 Fan
2020/0041709 A1 2/2020 Lee et al.

FOREIGN PATENT DOCUMENTS

| CN | 106662691 A | 5/2017 |
| CN | 106681055 A | 5/2017 |
| CN | 108153036 A | 6/2018 |
| KR | 10-2016-0148809 A | 12/2016 |
| WO | WO 2012/149051 A1 | 11/2012 |

* cited by examiner

OPTICAL MEMBER AND DISPLAY DEVICE INCLUDING THE SAME

CROSS-REFERENCE TO RELATED APPLICATION

This patent application claims priority to and the benefit of Korean Patent Application No. 10-2018-0104506, filed on Sep. 3, 2018, the entire content of which is incorporated herein by reference.

FIELD

Embodiments of the present disclosure relate to a display device, and for example, to a display device including an optical member having improved reliability.

BACKGROUND

Various display devices for providing image information in multimedia devices such as televisions, mobile phones, table computers, navigation devices, and game consoles are being developed. For example, in a display device including a liquid crystal display device, an organic electroluminescence display device, and the like, quantum dots are being introduced to improve display quality.

To more improve light efficiency in a display device using quantum dots, an optical member including a low-refractive index material is being used. Also, to improve reliability of the display device, it is beneficial to develop an optical member having improved durability while maintaining low-refractive index characteristics.

SUMMARY

Embodiments of the present disclosure provide a display device including an optical member, which includes a low-refractive index layer containing hollow particles having different sizes to provide high strength, to improve reliability and optical characteristics.

Embodiments of the present disclosure also provide a display device including an optical member, which includes a low-refractive index layer containing hollow particles having different sizes to provide good low-refractive characteristics.

An embodiment of the present disclosure provides an optical member including: a color filter member including quantum dots; and a low-refractive index layer below the color filter member and comprising a first hollow particle and a second hollow particle, wherein the first hollow particle has a particle size different from a particle size of the second hollow particle.

In an embodiment, the first hollow particle may have a diameter in a range of about 80 nm to about 120 nm, and the second hollow particle may have a diameter in a range of about 30 nm to about 70 nm.

In an embodiment, the first hollow particle may be present in the low-refractive index layer in an amount in a range of about 40 wt % to about 60 wt %, based on the total weight of the low-refractive index layer, and the second hollow particle may be present in the low-refractive index layer in an amount in a range of about 15 wt % to about 35 wt %, based on the total weight of the low-refractive index layer.

In an embodiment, the low refractive index layer may have a refractive index in a range of about 1 to about 1.2.

In an embodiment, each of the first hollow particle and the second hollow particle may include a core part including air and a shell part surrounding the core part.

In an embodiment, each of the first hollow particle and the second hollow particle may have a spherical shape.

In an embodiment of the present disclosure, an optical member includes: a matrix part; and a low-refractive index layer including a plurality of hollow particles that are dispersed in the matrix part, wherein the hollow particles includes a first hollow particle and a second hollow particle, the first hollow particle is present in the low-refractive index layer in an amount in a range of about 40 wt % to about 60 wt %, based on the total weight of the low-refractive index layer, and the second hollow particle is present in the low-refractive index layer is present in the low-refractive index layer in an amount in a range of about 15 wt % to about 35 wt %, based on the total weight of the low-refractive index layer.

In an embodiment, the first hollow particle may have a diameter greater than a diameter of the second hollow particle.

In an embodiment, the first hollow particle may have a diameter in a range of about 80 nm to about 120 nm, and the second hollow particle may have a diameter in a range of about 30 nm to about 70 nm.

In an embodiment, each of the first hollow particle and the second hollow particle may include a core part including air and a shell part surrounding the core part.

In an embodiment of the present disclosure, a display device includes: a base substrate; a plurality of pixels on the base substrate; a color filter member on one selected from an upper portion of the pixels and a lower portion of the pixels, and comprising quantum dots different that are from each other; and a low-refractive index layer on a lower portion of the color filter member, and including a matrix part and a plurality of hollow particles that are dispersed in the matrix part, wherein the hollow particles include a first hollow particle and a second hollow particle, and the first hollow particle has a particle size different from a particle size of the second hollow particle.

In an embodiment, the first hollow particle may be present in the low-refractive index layer in an amount in a range of about 40 wt % to about 60 wt %, based on the total weight of the low-refractive index layer, and the second hollow particle may be present in the low-refractive index layer in an amount in a range of about 15 wt % to about 35 wt %, based on the total weight of the low-refractive index layer.

In an embodiment, each of the pixels may include: a transistor on the base substrate; a first electrode coupled to the transistor; a second electrode facing the first electrode; and a liquid crystal layer between the first electrode and the second electrode.

In an embodiment, the display device may further include a backlight member including a light source unit below the base substrate and configured to provide light and a light guide plate including an emission surface facing the base substrate, a bottom surface facing the emission surface, a light incident surface facing the light source unit to couple the bottom surface to the emission surface, and a light opposite surface facing the light incident surface, wherein the low-refractive index layer may have a refractive index less than that of the light guide plate.

In an embodiment, the low-refractive index layer may be between the backlight member and the color filter member.

In an embodiment, the color filter member may include a color conversion part comprising the quantum dots and a barrier layer, and the barrier layer may seal the color conversion part together with the low-refractive index layer.

In an embodiment, the display device may further include a reflection layer configured to selectively reflect the light converted by the color conversion part according to a wavelength of the light, wherein the reflection layer may be between the pixels and the low-refractive index layer or between the low-refractive index layer and the color conversion part.

In an embodiment, each of the pixels may include a transistor on the base substrate and an organic light emitting element coupled to the transistor.

In an embodiment, the low-refractive index layer may be between the pixels and the color conversion part.

In an embodiment, the color filter member may include color converters that overlap at least one of the organic light emitting elements on a plane, that are configured to provide different light, and that include quantum dots different from the quantum dots of the color filter member, and each of the color converters may overlap the organic light emitting element.

BRIEF DESCRIPTION OF THE FIGURES

The accompanying drawings are included to provide a further understanding of the subject matter of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
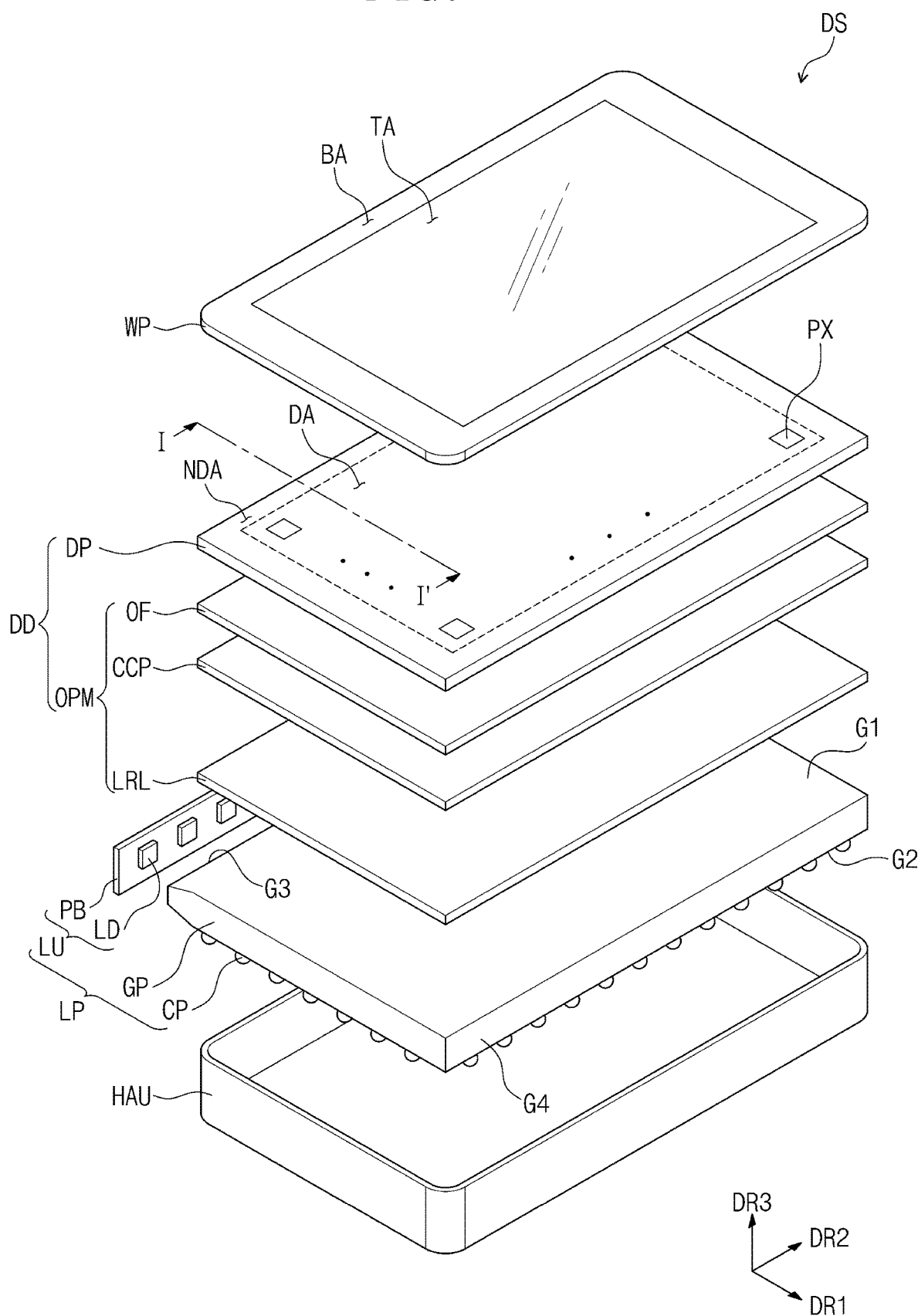
FIG. 1 is an exploded perspective view of a display device according to an embodiment of the present disclosure.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components may be exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, the terms "under", "below", "above", "upper", and the like are used for explaining relative association of components illustrated in the drawings. The terms refer to a relative arrangement and are described based on directions expressed in the drawings.

Unless otherwise defined, all terms (including technical and scientific terms) used herein have the same meaning as commonly understood by a person of ordinary skill in the art to which this disclosure belongs. Also, terms, such as those defined terms in commonly used dictionaries, are to be interpreted as having meanings that are consistent with their meaning in the context of the relevant art and/or the present specification, and should not be interpreted in an idealized or overly formal sense, unless expressly so defined herein.

The meaning of 'include' or 'comprise' specifies a property, a fixed number, a step, an operation, an element, a component or a combination thereof, but does not exclude other properties, fixed numbers, steps, operations, elements, components or combinations thereof. Hereinafter, exemplary embodiments of the present disclosure will be described with reference to the accompanying drawings.

Figure 2:
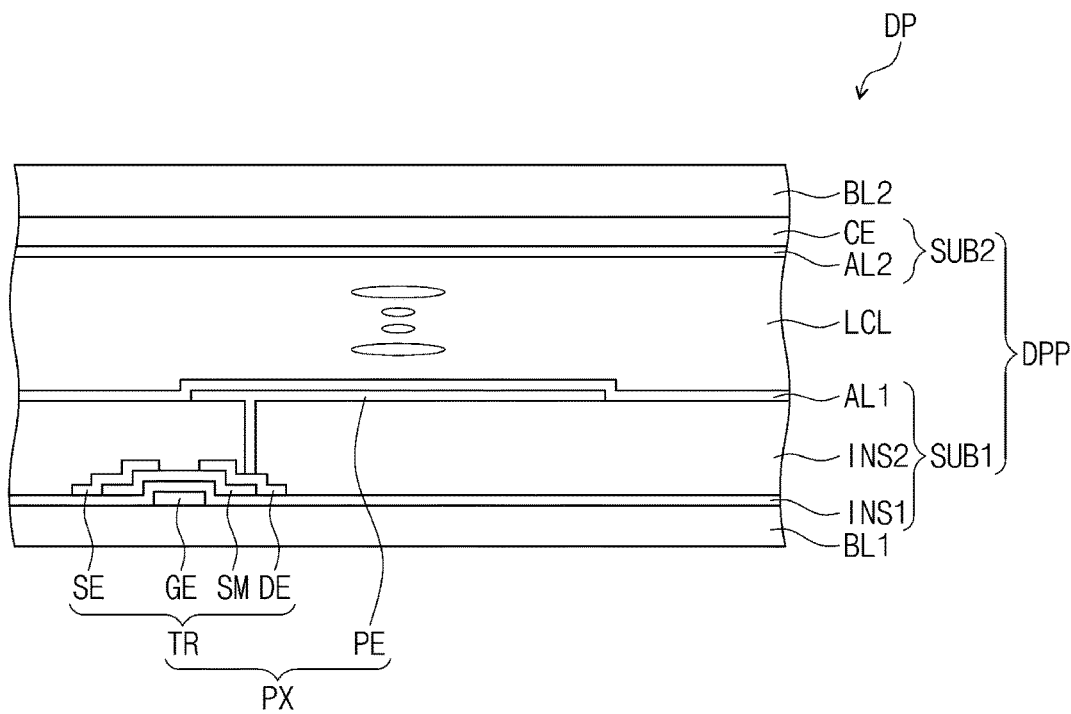
FIG. 2 is a cross-sectional view illustrating a portion of constituents of a display module according to an embodiment of the present disclosure.
Figure 3:
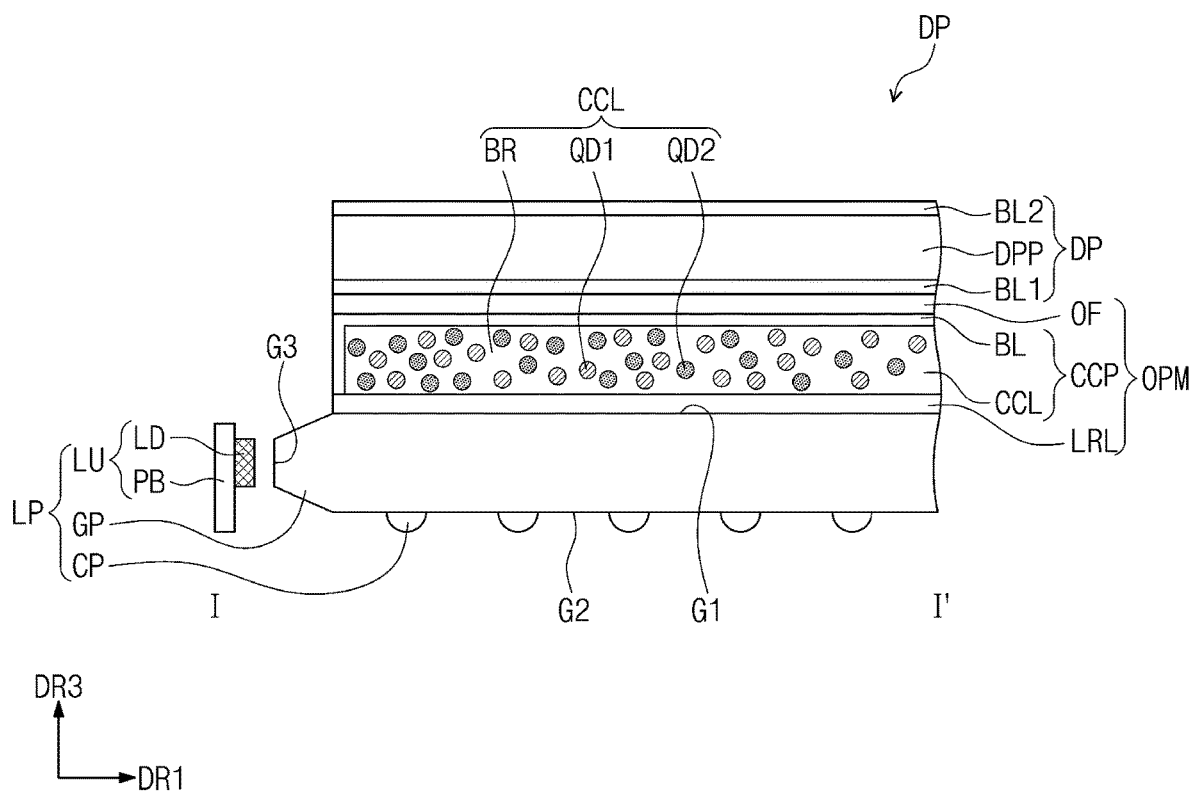
FIG. 3 is a cross-sectional view of a display panel according to an embodiment of the present disclosure.

FIG. 1 is an exploded perspective view of a display apparatus according to an embodiment of the present disclosure. FIG. 2 is a cross-sectional view illustrating a portion of constituents of a display module according to an embodiment of the present disclosure. FIG. 3 is a cross-sectional view of a display panel according to an embodiment of the present disclosure. Hereinafter, a display device DS according to an embodiment of the present disclosure will be described with reference to FIGS. 1-3.

Referring to FIGS. 1 and 2, the display device DS according to an embodiment of the present disclosure includes a window member WP, a display module DD, and an accommodation member HAU. The display device DS according to an embodiment may include a display element and may be configured to provide an image. For example, the display device DS may be a liquid crystal display device or an organic electroluminescence display device.

In FIG. 1 and the following drawings, a first directional axis DR1 to a third directional axis DR3 are illustrated. The directional axes described in this specification are relative concepts, and, for convenience of description, a direction of the third directional axis DR3 may be defined as a direction in which an image is provided to a user. Also, the first directional axis DR1 (hereinafter, referred to as a first direction) and the second directional axis DR2 (hereinafter, referred to as a second direction) may be perpendicular to each other. The third directional axis DR3 (hereinafter, referred to as a third direction) may be a normal direction with respect to a plane defined by the first direction DR1 and the second direction DR2. In FIG. 1, the plane defined by the first direction DR1 and the second direction DR2 may be a display surface on which an image is provided.

The window member WP is on a display module DD. The window member WP may be made of a material including glass, sapphire, and/or plastic. The window member WP may include a light transmitting area TA configured to transmit an image provided from the display module DD and a light blocking area BA which is adjacent to the light transmitting area TA and through which the image is not transmitted. The light transmitting area TA may be on a central portion of the display device DS on the plane defined in the first direction DR1 and the second direction DR2. The light blocking area BA may be in the periphery of the light transmitting area TA and have a frame shape surrounding the light transmitting area TA. However, embodiments of the present disclosure are not limited thereto. According to another embodiment, the window member WP may include only the light transmitting area TA. In this case, the light blocking area BA may be omitted. Also, the light blocking area BA may be on only at least one side of the light transmitting area TA. Unlike FIG. 1, the window member WP may be omitted in the display device DS according to an embodiment.

The display module DD includes a display panel DP, an optical member OPM, and a backlight member LP.

The display panel DP according to an embodiment may be between the window member WP and the accommodation member HAU. The display panel DP may include a liquid crystal display element or an organic electroluminescence display element. An embodiment in which the display panel DP according to this embodiment includes the liquid crystal display element will be described.

The display panel DP include a first base substrate BL1, a display unit DPP, and a second base substrate BL2. The display unit DPP includes a first display layer SUB1, a liquid crystal layer LCL, and a second display layer SUB2.

The first display layer SUB1, the liquid crystal layer LCL, and the second display layer SUB2 are between the first base substrate BL1 and the second base substrate BL2.

The first base substrate BL1 may provide a base layer on which constituents of the display unit DPP are deposited. Each of the first base substrate BL1 and the second base substrate BL2 may be a glass substrate, a metal substrate, and/or a plastic substrate. Also, each of the first base substrate BL1 and the second base substrate BL2 may be a transparent insulation substrate. For example, each of the first base substrate BL1 and the second base substrate BL2 may be the glass substrate and/or the plastic substrate. The first base substrate BL1 and the second base substrate BL2 may be arranged to face each other.

The display unit DPP includes pixels PX configured to display an image. The pixels PX may be arranged in the form of a matrix. The display unit DPP includes a display area DA on which the pixels PX are displayed and a non-display area NDA adjacent to the display area DA. The display area DA may overlap the light transmitting area TA of the window member WP. Although the non-display area NDA overlaps the light blocking area BA of the window member WP, embodiments of the present disclosure are not limited thereto. For example, the light blocking area BA may be omitted. Also, the display area DA may be on only at least one side of the non-display area NDA.

The first display layer SUB1 according to an embodiment may be defined as a layer including a transistor TR, insulation layers INS1 and INS2, a pixel electrode PE, and a first alignment layer AL1. The second display layer SUB2 may be defined as a layer including a second alignment layer AL2 and a common electrode CE.

Each of the pixels PX may be coupled to corresponding signal lines of a plurality of signal lines. The signal lines include a plurality of gate lines and a plurality of data lines. The plurality of gate lines are arranged in one direction of the display panel DP. The plurality of data lines crosses the plurality of gate lines so as to be insulated from the gate lines.

The pixels PX is between the first base substrate BL1 and the second base substrate BL2. Each of the pixels PX includes a transistor TR and liquid crystal capacitors PE, LCL, and CE. The transistor TR includes a control electrode GE, an input electrode SE, an output electrode DE, and a semiconductor pattern SM. The liquid crystal capacitors PE, LCL, and CE include a pixel electrode PE coupled to the transistor TR, a common electrode CE facing the pixel electrode PE, and a dielectric layer between the pixel electrode PE and the common electrode CE. In an embodiment of the present disclosure, the dielectric layer may correspond to the liquid crystal layer LCL.

The control electrode GE is on the first base substrate BL1. The control electrode GE is coupled to the corresponding gate line. The control electrode GE includes a conductive material. For example, the control electrode GE may include at least one selected from a metal such as nickel (Ni), molybdenum (Mo), aluminum (Al), titanium (Ti), copper (Cu), and tungsten (W), and/or metal oxide. The control electrode GE may be a single layer or a multilayer.

The first insulation layer INS1 covers the control electrode GE and the first base substrate BL1. The first insulation layer may include an inorganic material. For example, the first insulation layer INS1 may include at least one selected from oxide (SiOx), silicon nitride (SiNx), and silicon oxynitride (SiON).

The semiconductor pattern SM is on the first insulation layer INS1. At least a portion of the semiconductor pattern SM overlaps the control electrode GE. Although a bottom gate type transistor is illustrated in FIG. 2, embodiments of the present disclosure are not limited thereto. Embodiments of the present disclosure may be applied to a top gate type transistor in which the control electrode is above the input/output electrodes, and the present disclosure is not limited to a specific embodiment.

The input electrode SE and the output electrode DE are on the first insulation layer INS1. The input electrode SE may have one side coupled to the corresponding data line and the other side overlapping the semiconductor pattern SM. The output electrode DE may have one side overlapping the semiconductor pattern SM and the other side overlapping the pixel electrode PE. The other side of the input electrode SE and one side of the output electrode DE are spaced apart from each other.

Each of the input electrode SE and the output electrode DE may include a conductive material. For example, each of the input electrode SE and the output electrode DE may include at least one selected from nickel (Ni), chromium (Cr), molybdenum (Mo), aluminum (Al), titanium (Ti), copper (Cu), tungsten (W), and an allow thereof. Each of the input electrode SE and the output electrode DE may be a signal layer or a multilayer. The data line may be made of the same material as the input electrode SE and have the same layer structure as the input electrode SE.

The display panel DP according to embodiments of the present disclosure may further include a second insulation layer INS2. The second insulation layer INS2 is on the first insulation layer INS1. The second insulation layer INS2 covers the transistor TR. The second insulation layer INS2 may include an organic layer and/or an inorganic layer. The second insulation layer INS2 may be a single layer or a multilayer. For example, the second insulation layer INS2 may include an inorganic layer on the transistor TR and an organic layer on the inorganic layer and providing a flat top surface.

The pixel electrode PE is on the second insulation layer INS2. The pixel electrode PE may be electrically coupled to the output electrode DE through a contact hole defined to pass through the second insulation layer INS2. The pixel electrode PE may include a transparent conductive material. For example, the pixel electrode PE may include at least one selected from indium oxide, gallium oxide, titanium oxide, and zinc oxide. The pixel electrode PE electrically coupled to the output electrode DE through the contact hole may receive a voltage corresponding to a data signal.

The liquid crystal layer LCL includes liquid crystal molecules having directionality. The liquid crystal molecules may be variously arranged according to electric fields generated due to a difference in voltage between the common electrode CE and the pixel electrode PE. An amount of light passing through the liquid crystal layer LCL may be adjusted according to the arrangement of the liquid crystal molecules.

The display panel DP according to embodiments of the present disclosure may further include a first alignment layer AL1 and a second alignment layer AL2. The first alignment layer AL1 is between the pixel electrode PE and the liquid crystal layer LCL, and the second alignment layer AL2 is between the liquid crystal layer LCL and the common electrode CE to align the liquid crystal molecules of the liquid crystal layer LCL. Each of the first alignment layer AL1 and the second alignment layer AL2 may be provided as a vertical alignment layer and include polyamic acid, polysiloxane, polyimide, and/or the like.

The common electrode CE is on the second alignment layer AL2. As described above, the common electrode CE together with the pixel electrode PE may constitute the liquid crystal capacitor. The common electrode CE may include a transparent conductive material. For example, the common electrode CE may include at least one selected from indium tin oxide, indium zinc oxide, indium gallium zinc oxide, fluorine zinc oxide, gallium zinc oxide, and tin oxide.

Referring to FIG. 1, according to an embodiment of the present disclosure, the optical member OPM may include an optical sheet member OF, a color filter member CCP, and a low-refractive index layer LRL.

The optical sheet member OF is below the display panel DP. The optical sheet member OF may include at least one selected from a diffusion sheet, a prism sheet, and a brightness enhancement sheet. The diffusion sheet may be located closest to the backlight member LP of the optical sheet member OF. The diffusion sheet may disperse light incident from the light guide plate GP to prevent or reduce partial concentration of the light. The diffusion sheet may include, for example, at least one of polyester or polycarbonate. The prism sheet may be configured to convert side light into front light with respect to the light passing through the diffusion sheet and concentrate the emitted light to improve enhance brightness. The brightness enhancement sheet (for example, dual brightness enhance film) may reduce a loss of light emitted from the prism sheet. In the display device DS according to embodiments of the present disclosure, the optical sheet member OF may be omitted.

Referring to FIG. 3, the color filter member CCP according to an embodiment may be between the display panel DP and the light source unit LU. The color filter member CCP includes a color conversion part CCL and a barrier layer BL.

The color conversion part CCL may include a plurality of conversion particles that convert the light incident from the light guide plate GP. Each of the conversion particles may be configured to absorb at least a portion of the incident light to emit light having a special color or to transmit the light as it is. When light incident into the color conversion part CCL has suitable or sufficient energy for exciting the light conversion particles, the conversion particles may absorb at least a portion of the incident light and then be excited and stabilized to emit light having a special color. On the other hand, when the incident light has energy that is difficult to excite the conversion particles, the incident light may pass through the color conversion part CCL as it is and thus be visible from the outside.

The color conversion part CCL may include a first conversion material QD1, a second conversion material QD2, and a base resin BR.

The base resin BR may be a medium in which the first conversion material QD1 and the second conversion material QD2 are dispersed. In general, any suitable medium may be called the base resin BR regardless of its name, additional other functions, formation materials, and the like as long as the medium, which is called as a binder, is capable of dispersing the first conversion material QD1 and the second conversion material QD2. The base resin BR may be a polymer resin. For example, the base resin BR may include various suitable resin compositions such as, for example, an acrylic resin, a urethane-based resin, and silicon. However, embodiments of the present disclosure are not limited thereto. For example, in this specification, the base resin BR may include an epoxy-based resin, and/or the like. The base resin BR may be a transparent resin.

Light emitted from the conversion particles of the color conversion part CCL may be emitted in various directions. The color conversion part CCL may include conversion materials QD1 and QD2 having different sizes (e.g., different particle sizes) according to a kind of light source unit LU for generating white light. The conversion materials QD1 and QD2 according to an embodiment may be quantum dots QD.

For example, the conversion materials QD1 and QD2 may be selected from Group II-VI compounds, Group IV-VI compounds, Group IV elements, Group IV compounds, and combinations thereof. The Group II-VI compounds may be selected from binary element compounds selected from the group consisting of CdSe, CdTe, ZnS, ZnSe, ZnTe, ZnO, HgS, HgSe, HgTe, MgSe, MgS, and a combination thereof, ternary element compounds selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and quaternary element compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof. The Group III-V compounds may be selected from binary element compounds selected from the group consisting of GaN, GaP, GaAs, GaSb, AlN, AlP, AlAs, AlSb, InN, InP, InAs, InSb, and a combination thereof, ternary element compounds selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and quaternary element compounds selected form the group consisting of GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, and a combination thereof. The Group IV-VI compounds may be selected from binary element compounds selected from the group consisting of SnS, SnSe, SnTe, PbS, PbSe, PbTe, and a combination thereof, ternary element compounds selected from the group consisting of SnSeS, SnSeTe, SnSTe, PbSeS, PbSeTe, PbSTe, SnPbS, SnPbSe, SnPbTe, and a combination thereof, and quaternary element compounds selected form the group consisting of SnPbSSe, SnPbSeTe, SnPbSTe, and a combination thereof. The Group IV elements may be selected from the group consisting of Si, Ge, and a combination thereof. The Group IV compounds may be binary element compounds selected from the group consisting of SiC, SiGe, and a combination thereof. Also, a shape of each of the conversion materials QD1 and QD2 is not particularly limited, and may be any suitable shape generally used in the fields of the present disclosure. For example, each of the conversion materials QD1 and QD2 may have a shape such as a spherical shape, a pyramidal shape, a multi-arm shape, or a shape of nanoparticles, nanotubes, nanowires, nanofibers, nano-plate-like particles, and/or the like.

However, embodiments of the present disclosure are not limited thereto. For example, the color conversion part CCL may include a plurality of phosphors. When light emitted from the light source unit LU is blue light, the color conversion part CCL may include a plurality of phosphors that absorb the blue light and emit red light. The phosphors that emit the red light may be at least one of, for example, sulfur (S), $2Si_5N_8$, CaZn (CaAlSiN$_3$), CaMoO$_4$, or Eu$_2$Si$_5$N$_8$. The color conversion part CCL may include phosphors that absorb the blue light emitted from the backlight member BP and emit green light. The phosphors that emit the green light may be at least one selected from, for example, yttrium aluminum garnet (YAG), (Ca, Sr, Ba)$_2$SiO$_4$, SrGa$_2$S$_4$, BAM, alpha-SiAlON, beta-SaAlON, Ca$_3$Sc$_2$Si$_3$O$_{12}$, Tb$_3$Al$_5$O$_{12}$, BaSiO$_4$, CaAlSiON, and (Sr1−xBax)Si$_2$O$_2$N$_2$. The conversion materials QD1 and QD2 according to embodiments of the present disclosure absorb the blue light to convert the blue light into light having a green or red wavelength band. Also, a portion of the blue light may not be absorbed into the conversion materials QD1 and QD2. Thus, the light having blue, green, and red wavelength bands may be mixed with each other in the color conversion part CCL to generate white light.

The barrier layer BL covers the color conversion part CCL. The barrier layer BL may seal the color conversion part CCL together with the low-refractive index layer LRL to prevent or reduce exposure of a side surface of the color conversion part CCL.

The barrier layer BL may prevent or reduce the permeation of moisture and/or oxygen (hereinafter, referred to as 'moisture/oxygen') introduced into the color conversion part CCL.

The barrier layer BL may include at least one inorganic layer. For example, the barrier layer BL may include an inorganic material. For example, the barrier layer BL may include at least one selected from silicon nitride (SiNx), aluminum nitride (AlNx), zirconium nitride (ZrNx), titanium nitride (TiNx), hafnium nitride (HfNx), silicon oxide (SiOx), aluminum oxide (AlOx), titanium oxide (TiOx), silicon oxynitride (SiOxNy), and a metal thin film having secured light transmittance. The barrier layer BL may include an organic layer, for example, at least one selected from polyimide, polyethylene terephthalate, polycarbonate, epoxy, polyethylene, and polyacrylate. The barrier layer may be a single layer or a plurality of layers.

The low-refractive index layer LRL may be between the light guide plate GP and the color filter member CCP. The low-refractive index layer LRL may cover a bottom surface of the color conversion part CCL to seal the color conversion part CCL together with the barrier layer BL. Thus, the low-refractive index layer LRL may function as a barrier layer on the bottom surface of the color conversion part CCL.

The low-refractive index layer LRL may have a refractive index less than that of the light guide plate GP. For example, the low-refractive index layer LRL may have a refractive index in a range of about 1 to about 1.2. When the color conversion part CCL on the light guide plate GP has a refractive index similar to that of the light guide plate GP, total reflection may not be properly performed on a boundary between the light guide plate GP and the color conversion part CCL. Thus, the light incident into the light guide plate GP may not be guided to the inside of the light guide plate GP but be emitted to the outside to cause a hot spot phenomenon in which light is concentrated into only a set or predetermined area.

According to embodiments of the present disclosure, to prevent or reduce the occurrence of the foregoing phenomenon, the low-refractive index layer LRL having a refractive index less than that of the light guide plate GP may be between the light guide plate GP and the color conversion part CCL. Thus, a minimum angle at which the total reflection is realized on the boundary the light guide plate GP and the low-refractive index layer LRL may increase to improve total reflection efficiency within the light guide plate GP.

The backlight member LP may be below the display panel DP to provide light to the display panel DP. The backlight member LP according to embodiments of the present disclosure includes the light source unit LU, the light guide plate GP, and an emission pattern CP.

The light source unit LU includes a circuit board PB and a light source LD. The circuit board PB may be electrically coupled to the light source LD to control an amount of light emitted from the light source LD. As illustrated in FIG. 1, the light source LD may be provided in plurality on the circuit board PB. The light source unit LU according to embodiments of the present disclosure may be an edge-type light source on a side surface of the light guide plate GP.

The circuit board PB may be provided in plurality to correspond to the plurality of light sources. In some embodiments, the circuit board PB may include a substrate and a circuit layer. The circuit layer is electrically coupled to the light source LD. For example, the circuit layer may be coupled to electrodes of the light source LD. The circuit layer may be constituted by conductive lines and/or conductive pads, which are respectively coupled to the electrodes. The circuit layer may be made of a metal material, for example, copper (Cu).

The light source LD may be electrically coupled to the circuit layer. The light source LD may include a light emitting diode (LED) generating light in response to an electrical signal received from the circuit layer. The light emitting diode may have a structure in which a first electrode, an n-type semiconductor layer, an active layer, a p-type semiconductor layer, and a second electrode facing the first electrode and electrically coupled to the circuit layer, which are electrically coupled to each other, are sequentially laminated. When a driving voltage is applied to the light emitting diode, electrons and holes move to be coupled to each other, and thus, light may be generated due to the coupling of the electrons and the hole. The light source LD according to an embodiment of the present disclosure may include a plurality of light emitting diodes. Light generated by the light emitting diodes may have the same color or different colors, but embodiments of the present disclosure are not limited thereto. The light source LD according to an embodiment of the present disclosure may emit blue light.

The light guide plate GP is below the display panel DP. The light guide plate GP may include a material having high light transmittance in a visible light region. The light guide plate GP according to an embodiment of the present disclosure may be made of an optically transparent material. For example, the light guide plate GP may include a glass substrate, a plastic substrate, or a combination thereof. The light guide plate GP made of glass according to an embodiment of the present disclosure will be described.

The light guide plate GP includes an emission surface G1, a bottom surface G2, and a plurality of side surfaces. The light guide plate GP guides light received from the light source unit LU in a direction of the display panel DP.

The emission surface G1 may be defined as a surface facing the display panel DP. The bottom surface G2 faces the emission surface G1. As illustrated in FIGS. 1 and 3, the plurality of side surfaces (hereinafter, referred to as side surfaces) include a first side surface G3 and a second side surface G4 facing each other in the first direction DR1, and a third side surface and a fourth side surface facing each other in the second direction DR2 and coupled to the first side surface G3 and the second side surface G4.

According to an embodiment of the present disclosure, an incident surface is defined on at least one surface selected from the first side surface G3 and the second side surface G4. The incident surface may face the light source LD to receive the light provided from the light source LD. FIG. 3 illustrates an embodiment in which the incident surface is defined on the first side surface G3. The light guide plate GP may guide the light incident into the first side surface G3 (e.g., the incident surface) to emit the light through the emission surface G1, thereby providing the light to the display panel DP. However, this is merely an example. For example, the incident surface may be defined to be any one of the second to fourth side surfaces or defined to be two or more side surfaces, but embodiments of the present disclosure are not limited thereto.

The emission pattern CP may be made of a material having a refractive index different from that of the light guide plate GP. The emission pattern CP may be configured to change a direction of the light to transmit the light emitted from the light source unit LU and then incident into one side surface of the light guide plate GP to other side surfaces or to transmit the light incident into the bottom surface of the light guide plate GP to the emission surface G1 that is the top surface of the light guide plate GP.

According to an embodiment of the present disclosure, the optical member OPM of the display device DS may be defined by the optical sheet member OF, the color filter member CCP, the low-refractive index layer LRL, and the backlight member LU.

Referring again to FIG. 1, the accommodation member HAU may be below the display member DP to accommodate the display member DP. The accommodation member HAU may cover the display member DP so that a top surface that is the display surface of the display member DP is exposed. The accommodation member HAU may cover a side surface and a bottom surface of the display member DP and expose the entire (e.g., substantially the entire) top surface of the display member DP. On the other hand, the accommodation member HAU may cover a portion of the top surface in addition to the side surface and the bottom surface of the display member DP.

Figure 4:
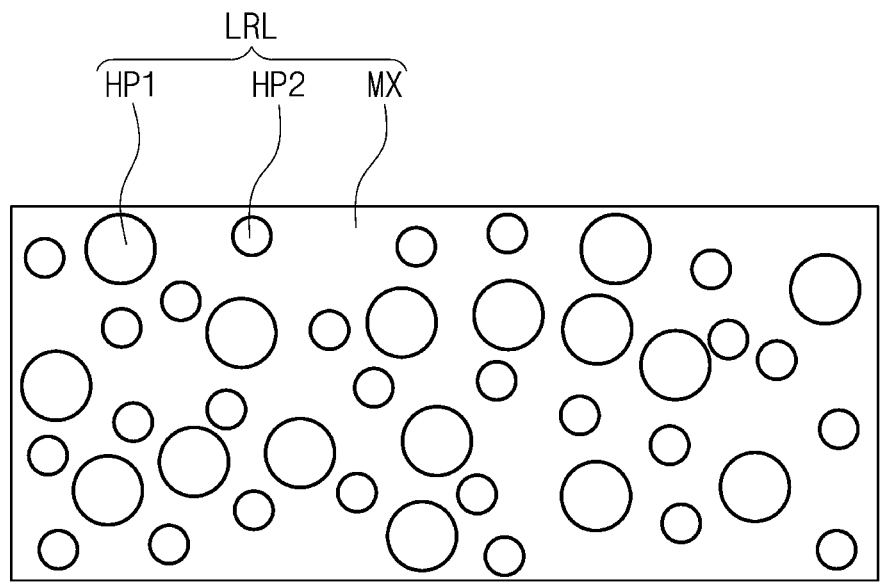
FIG. 4 is an enlarged view of a low-refractive index layer according to an embodiment of the present disclosure.
Figure 5A:
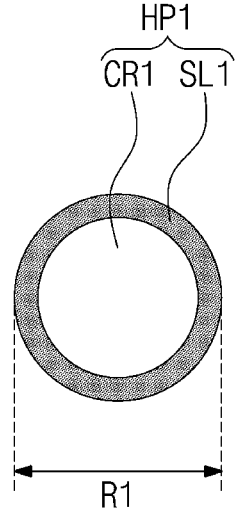
FIGS. 5A and 5B are cross-sectional views of hollow particles according to an embodiment of the present disclosure.
Figure 5B:
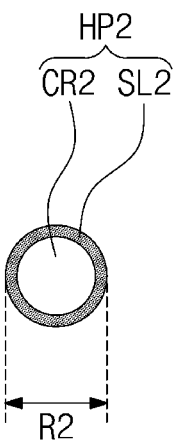
Figure 6:
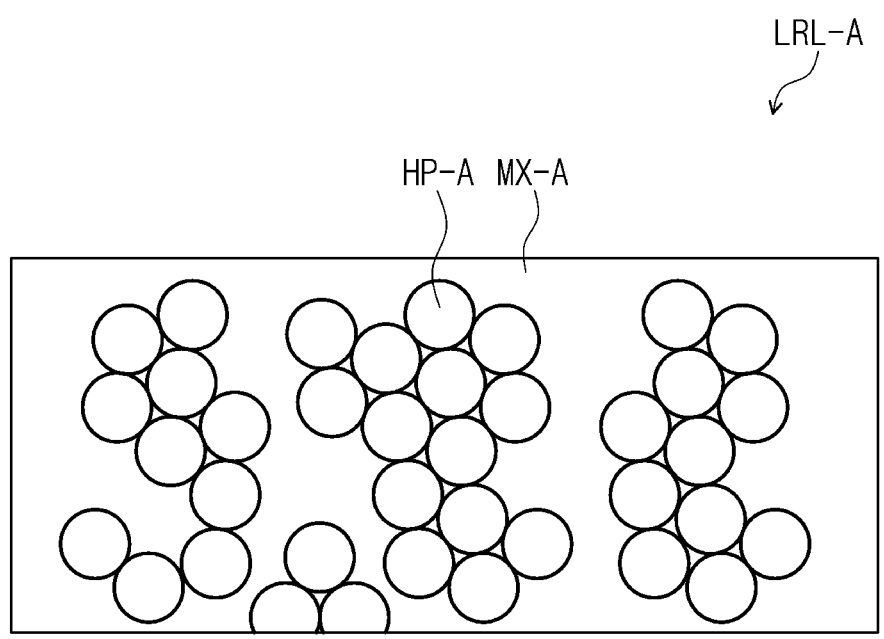
FIG. 6 is an enlarged view of a low-refractive index layer according to a comparative embodiment.

FIG. 4 is an enlarged view of the low-refractive index layer according to an embodiment of the present disclosure. FIGS. 5A and 5B are cross-sectional views of hollow particles according to an embodiment of the present disclosure. FIG. 6 is an exploded perspective view of a display device according to a comparative embodiment.

Referring to FIG. 4, the low-refractive index layer LRL according to an embodiment of the present disclosure includes a first hollow particle HP1, a second hollow particle HP2, and a matrix part MX. The first hollow particle HP1 and the second hollow particle HP2 may be dispersed in the matrix part MX.

The matrix part MX may include a polymer material. The matrix part MX may include at least one selected from an acrylic-based polymer, a silicone-based polymer, a urethane-based polymer, and an imide-based polymer. For example, the matrix part MX may include one of polymeric materials selected from acrylic-based polymers, silicone-based polymers, urethane-based polymers, and imide-based polymers, or a combination of a plurality of polymer materials. Also, the matrix part MX may include at least one selected from a siloxane polymer, a silsesquioxane polymer, an acrylic-based polymer substituted with a fluorine atom, a silicone-based polymer substituted with a fluorine atom, a urethane-based polymer substituted with a fluorine atom, and an imide polymer substituted with the fluorine atom.

The matrix part MX may be made of an acrylic-based resin, a silicone-based resin, a urethane-based resin, and/or an imide-based resin. The matrix part MX may be formed by solidifying a polymer resin such as an acrylic-based resin, a silicone-based resin, a urethane-based resin, and/or an imide-based resin in a high temperature process and/or an ultraviolet treatment process.

Referring to FIGS. 5A and 5B, each of the first hollow particle HP1 and the second hollow particle HP2 may have the form of a core shell. In an embodiment, each of the first hollow particle HP1 and the second hollow particle HP2 may have a sphere shape (e.g., a spherical shape such as a substantially spherical shape).

The first hollow particle HP1 may include a first core part CR1 and a first shell part SL1 surrounding the first core part CR1. The second hollow particle HP2 may include a second core part CR2 and a second shell part SL2 surrounding the second core part CR2.

The first core part CR1 may be defined by the first shell part SL1, and the second core part CR2 may be defined by the second shell part SL2. Each of the first shell part SL1 and the second shell part SL2 may be a layer made of an inorganic material. Each of the first shell part SL1 and the second shell part SL2 may include at least one selected from silicon oxide ($SiO_2$), fluorine magnesium ($MgF_2$), and iron oxide ($Fe_3O_4$). For example, in the low-refractive index layer LRL according to an embodiment, each of the first hollow particle HP1 and second hollow particle HP2 may be hollow silica.

Also, each of the first hollow particle HP1 and the second hollow particle HP2 may include an organic layer surrounding an outer surface of an inorganic layer. The organic layer may serve to improve dispersibility of the first hollow particle HP1 and the second hollow particle HP2 in the matrix part MX. For example, the organic layer may be on the outer surfaces of the first shell part SL1 and the second shell part SL2 so that the first hollow particle HP1 and the second hollow particle HP2 are uniformly (e.g., substantially uniformly) dispersed in the matrix part MX without being aggregated with each other.

Air may be filled into the first part CR1 and the second core part and CR2. For example, the first core part CR1 and the second core part CR2 may include air having the composition of standard ambient air. However, the present disclosure is not limited to the foregoing embodiment. For example, in the first hollow particle CR1 and the second hollow particle HP2, the first core part CR1 and the second core part CR2 may be filled with a liquid or gas having low-refractive characteristics. Each of the first core part CR1 and the second core part CR2 may be a void defined by the first shell part SL1 and the second shell part SL2.

According to embodiments of the present disclosure, the first hollow particle HP1 and the second hollow particle HP2 may have sizes (e.g., particle sizes) different from each other. For example, the first hollow particle HP1 may a particle size larger than a particle size of the second hollow particle HP2. The plurality of second hollow particles HP2 provided in the matrix part MX may be between the plurality of first hollow particles HP1.

The first hollow particle HP1 according to an embodiment of the present disclosure may have a first diameter R1 of about 80 nm to about 120 nm. The second hollow particle HP2 may have a diameter in a range of about 30 nm to about 120 nm.

As the diameter of the hollow particles increases, an amount of the air layer filled in the core part increases. Thus, a refractive index of the low-refractive index layer LRL may be reduced. However, as a content (e.g., concentration or amount) of the hollow particles having a large diameter increases in the low-refractive index layer LRL, strength of the low-refractive index layer may be lowered.

TABLE 1

| | Reference example | First comparative example | second comparative example | Third comparative example | Fourth comparative example |
| --- | --- | --- | --- | --- | --- |
| Refractive index | 1.20 | 1.25 | 1.23 | 1.21 | 1.20 |
| Occurrence or non-occurrence of rupture | non-occurrence | non-occurrence | non-occurrence | Occurrence | Occurrence |
| Scattering degree | <0.5 | 0.2 | 1.0 | 8.5 | 17.3 |

Table 1 shows comparative examples in which a refractive index, an occurrence of rupture, and a scattering degree (Haze) were respectively evaluated for a plurality of low-refractive index layers having different content ratios (amounts or concentrations) of the hollow particles. Table 1 shows values according to contents (amounts or concentrations) of the hollow particles and the matrix part MX in which the hollow particle has a diameter of about 80 nm to about 120 nm. A reference example may have a refractive index of about 1.20 or less, no occurrence of rupture, and a scattering degree of less than 0.5. Thus, the low-refractive index layer according to the reference example may provide a low-refractive index layer having improved impact resistance, and total reflection efficiency may increase to improve optical characteristics of the low-refractive index layer.

A first comparative example is an embodiment in which the hollow particle has a content of about 65% (e.g., is present in an amount of 65 wt %), and the matrix part MX has a content about 35% (e.g., is present in an amount of 35 wt %). A second comparative example is an embodiment in which the hollow particle has a content of about 70% (e.g., is present in an amount of 70 wt %), and the matrix part MX has a content about 30% (e.g., is present in an amount of 30 wt %). A third comparative example is an embodiment in which the hollow particle has a content of about 75% (e.g., is present in an amount of 75 wt %), and the matrix part MX has a content about 25% (e.g., is present in an amount of 25 wt %), and a fourth comparative example is an embodiment in which the hollow particle has a content of about 80% (e.g., is present in an amount of 80 wt %), and the matrix part MX has a content about 20% (e.g., is present in an amount of 20 wt %).

The content of the hollow particles in the matrix part MX increases gradually from the first comparative example to the fourth comparative example. Thus, a first value corresponding to the refractive index may decrease gradually from the first comparative example to the fourth comparative example. However, as the content of the hollow particles increases, the occurrence of the rupture and the scattering degree of the low-refractive index layer LRL may increase to cause a stain defect.

Referring to FIG. 6, when hollow particles HP-A corresponding to the comparative example 2 or the comparative example 3 are contained in a low-refractive index layer LRL-A, aggregation due to the Van Der Waals attraction between the hollow particles HP-A may occur. Thus, an area in which a matrix part MX-A contacts the hollow particles HP-A may be reduced. The contact between the hollow particles HP-A and the matrix part MX-A may be reduced as the number of hollow particles HP-A in which the aggregation occurs increases. Thus, the low-refractive index layer LRL-A may be deteriorated or reduced in durability.

The low-refractive index layer LRL according to embodiments of the present disclosure includes a first hollow particle HP1 and a second hollow particle HP2, which have sizes (e.g., particle sizes) different from each other. For example, the second hollow particle HP2 may have a diameter R2 that is relatively less than that of the first hollow particle HP1. The more the diameter of the hollow particles is reduced, the more the Van Der Waals attraction is reduced. Thus, the dispersion between the hollow particles HP1 and HP2 may have a beneficial effect.

The low-refractive index layer RLR according to embodiments of the present disclosure includes the second hollow particle HP2 having a small diameter to increase a contact area between the hollow particles HP1 and HP2 and the matrix part MX, thereby providing an optical member OPM (see FIG. 1) having improved durability. Therefore, the display device DS having the improved reliability and optical characteristics may be provided.

TABLE 2

| | Content ratio of first hollow particle | | | | | | |
|---|---|---|---|---|---|---|---|
| | 35% | 40% | 45% | 50% | 55% | 60% | 75% |
| | Content ratio of second hollow particle | | | | | | |
| | 40% | 35% | 30% | 25% | 20% | 15% | 0% |
| Refractive index | — | 1.22 | 1.20 | 1.20 | 1.20 | 1.20 | 1.23 |
| Occurrence or non-occurrence of rupture | — | non-occurrence | non-occurrence | non-occurrence | non-occurrence | non-occurrence | non-occurrence |
| Scattering degree | — | 0.2 | 0.3 | 0.3 | 0.4 | 0.4 | 0.4 | 0.2 |

Table 2 shows comparative examples in which a refractive index, an occurrence of rupture, and a scattering degree (Haze) according to contents of a first hollow particle HP1 and a second hollow particle HP2 of a low-refractive index layer LRL were respectively evaluated. The remaining 25% excluding a content of the first hollow particles and a content of the second hollow particles in the low-refractive index layer LRL may be a content of the matrix part MX. According to embodiments of the present disclosure, the first hollow particles HP1 in the low-refractive index layer LRL may have a content of about 40% to about 60% (e.g., be present in an amount of 40 wt % to 60 wt %). The second hollow particles HP2 may have a content of about 15% to about 35% (e.g., be present in an amount of 15 wt % to 35 wt %).

When the first hollow particles HP1 have a content of about 35% (e.g., 35 wt %), and the second hollow particles HP2 have a content of about 40% (e.g., 40 wt %), although defects due to an occurrence of rupture and scattering do not occur (or substantially do not occur), a refractive index corresponding to the first value may exceed about 1.2. Thus, the total reflection efficiency between the low-refractive index layer LRL (see FIG. 1) and the light guide plate GP (see FIG. 1) may be deteriorated or reduced. Also, the first hollow particles HP1 have a content of about 75% (e.g., 75 wt %), and the second hollow particles HP2 have a content of about 0%, similarly, although the defects due to the occurrence of the rupture and the scattering do not occur (or substantially do not occur), the total reflection efficiency between the low-refractive index layer LRL and the light guide plate GP may be deteriorated or reduced.

According to an embodiment of the present disclosure, the low-refractive index layer LRL including the hollow particles HP1 and HP2 having the different sizes (e.g., different particle sizes) may be on the light guide plate GP to provide the optical member OPM (see FIG. 1) having superior strength. Therefore, the display device having the improved reliability may be provided.

Figure 7:
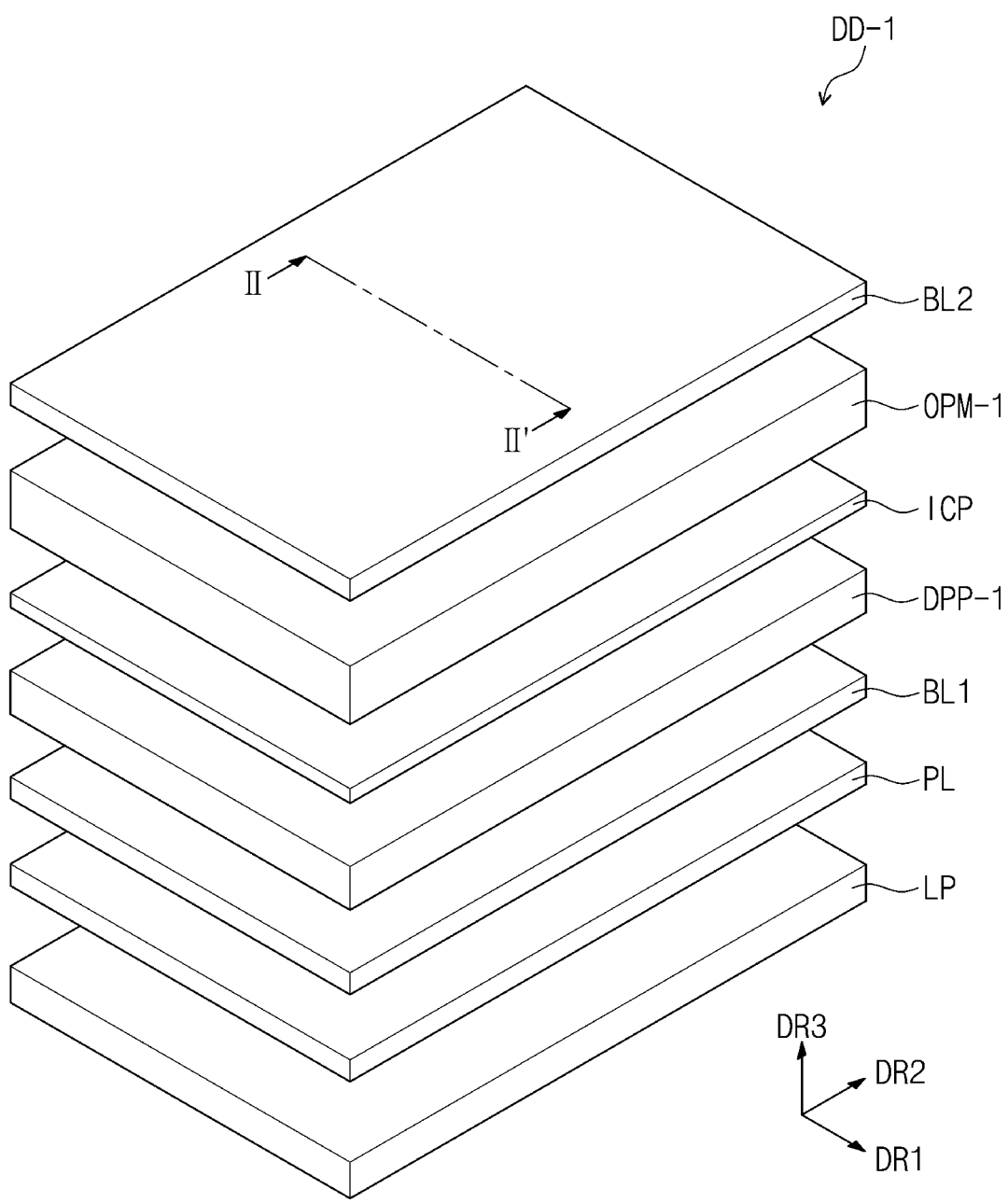
FIG. 7 is an exploded perspective view of a display device according to an embodiment of the present disclosure.
Figure 8:
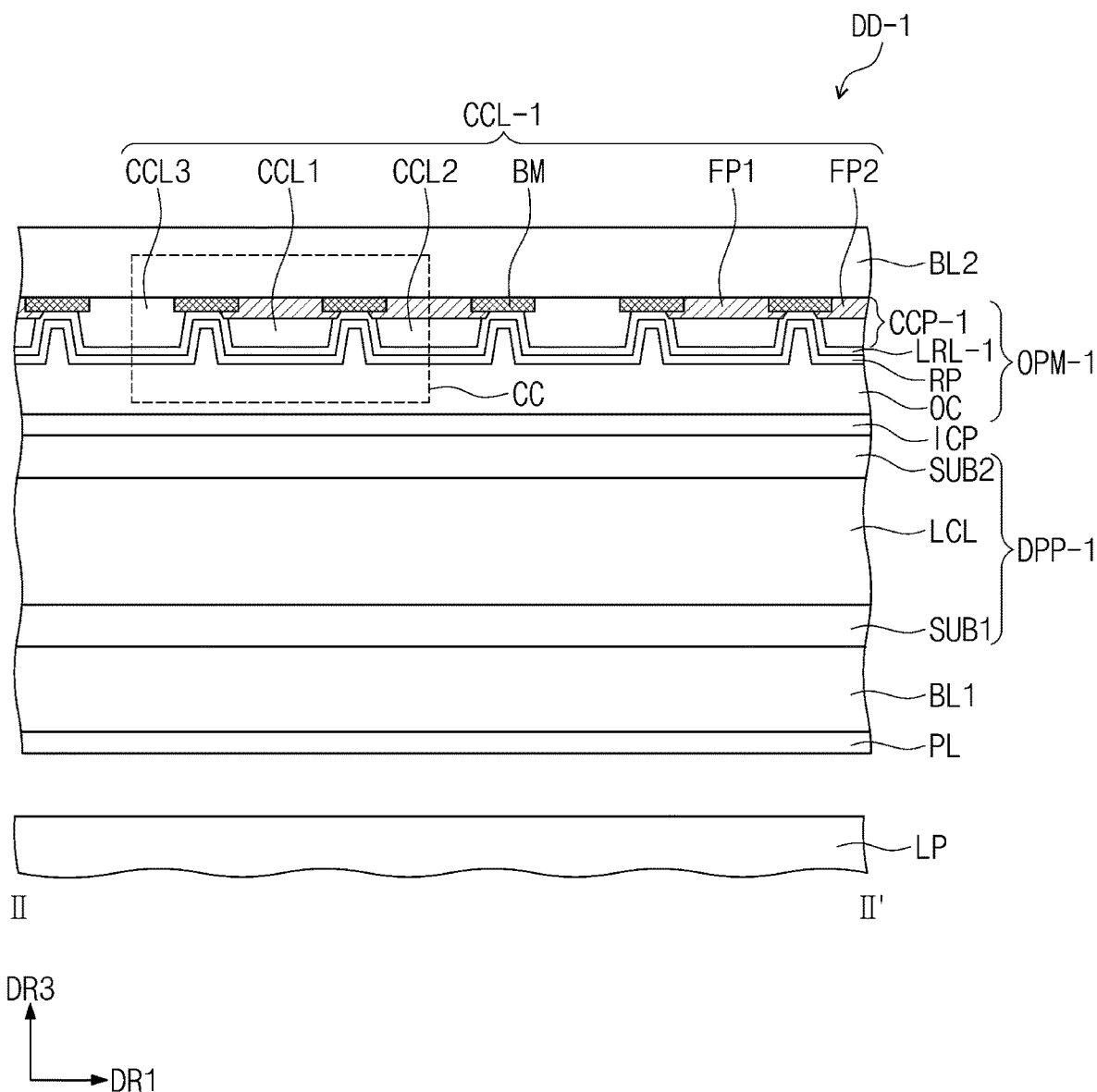
FIG. 8 is a cross-sectional view of the display device according to an embodiment of the present disclosure.
Figure 9:
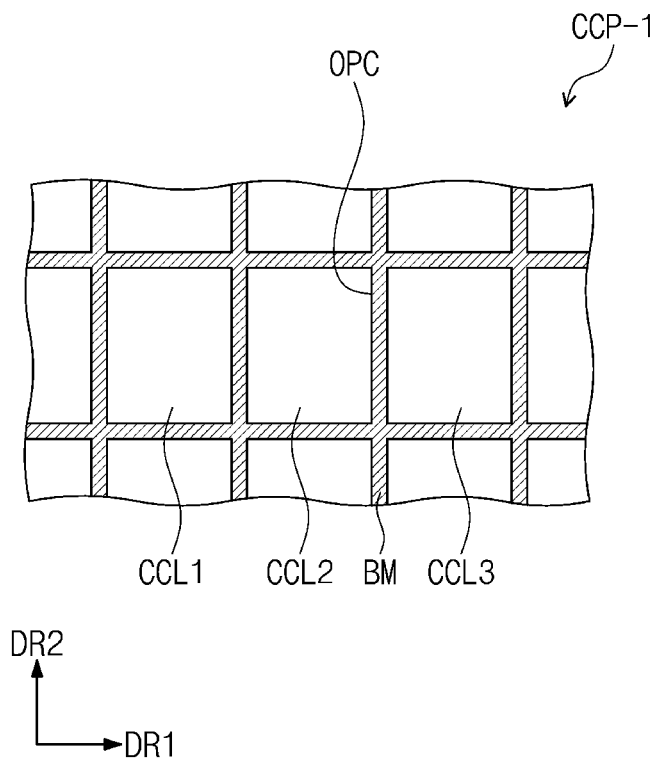
FIG. 9 is a plan view of a portion of a color filter member according to an embodiment of the present disclosure.
Figure 10A:
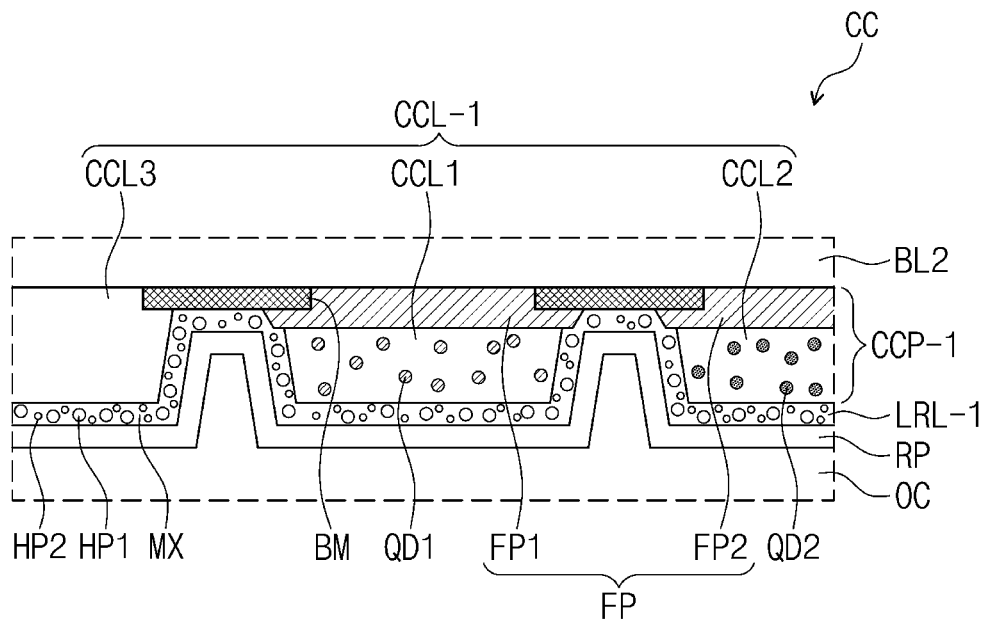
FIG. 10A is an enlarged view of a region CC of FIG. 8.
Figure 10B:
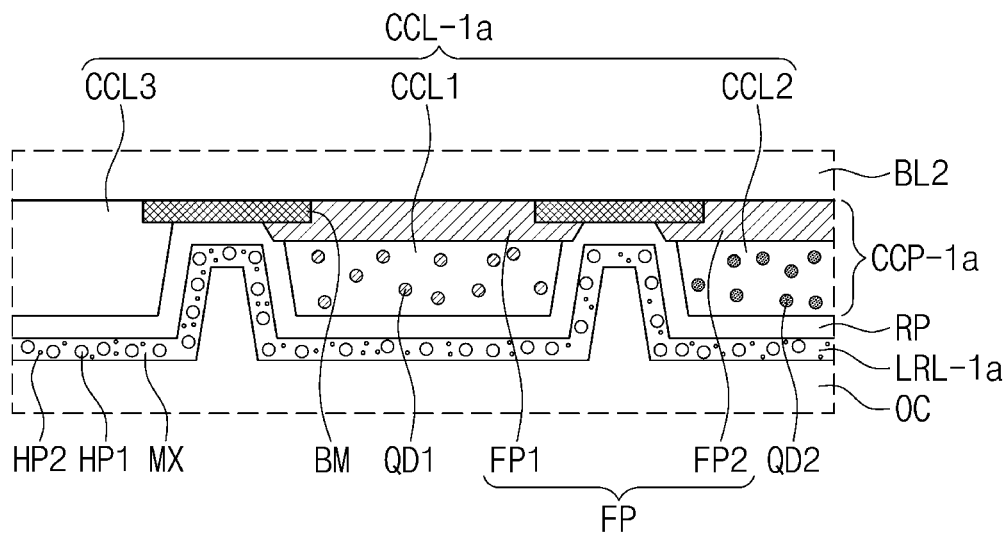
FIGS. 10B and 10C are cross-sectional views illustrating a portion of constituents of the display device according to an embodiment of the present disclosure.
Figure 10C:
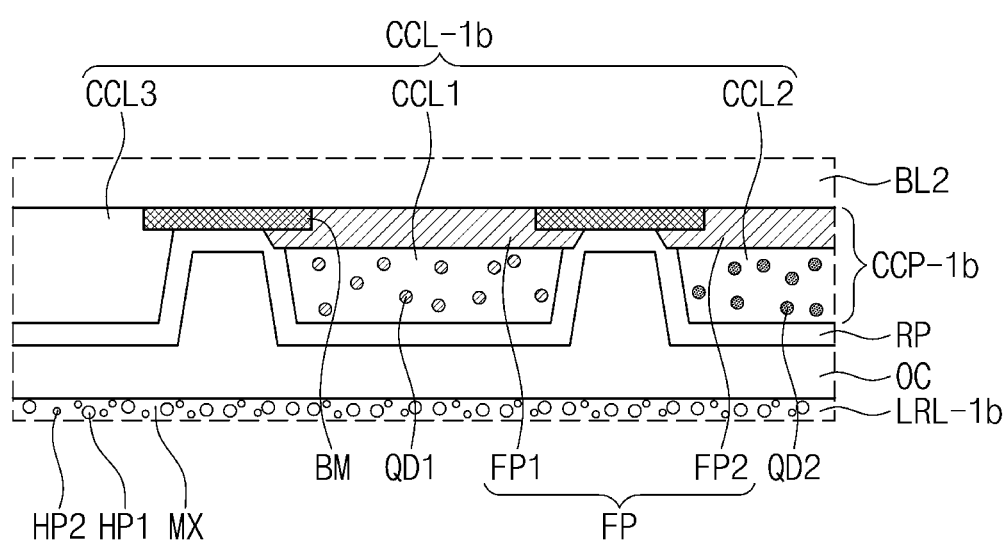

FIG. 7 is an exploded perspective view of a display apparatus according to an embodiment of the present disclosure. FIG. 8 is a cross-sectional view of the display device according to an embodiment of the present disclosure. FIG. 9 is a plan view of a portion of a color filter member according to an embodiment of the present disclosure. FIG. 10A is an enlarged view of a region CC of FIG. 8. FIGS. 10B and 10C are cross-sectional views illustrating a portion of constituents of the display device according to an embodiment of the present disclosure. The same reference numerals are used for the same components as that of FIGS. 1-5B, and thus, duplicative descriptions thereof will not be repeated here.

Referring to FIG. 7, a display module DD-1 according to an embodiment includes a backlight member LP, a first base substrate BL1, a display unit DPP-1, an optical member OPM-1, a second base substrate BL2, a first polarizing layer PL, and a second polarizing layer CP.

According to an embodiment of the present disclosure, the optical member OPM-1 may include a color filter member CCP-1, a low-refractive index layer LRL-1, a reflection layer RP, and a planarization layer OC.

The display module DD-1 according to an embodiment may include the first polarizing layer PL and the second polarizing layer CP. The first polarizing layer PL may be between the backlight member LP and the first base substrate BL1. The first polarizing layer PL may be provided as a separate member or include a polarizer formed through coating or deposition. The first polarizing layer PL may be formed by applying a material containing a dichroic dye and a liquid crystal compound. In some embodiments, the first polarizing layer PL may include a wire grid-type polarizer.

The first polarizing layer PL may be on a bottom surface of the first base substrate BL1. However, embodiments of the present disclosure are not limited thereto. For example, the first polarizing layer PL may be on the first base substrate BL1. In this case, the first polarizing layer PL may be between the liquid crystal layer LCL and the first base substrate BS1.

The second polarizing layer ICP may be between the optical member OPM-1 and the display panel DP. The second polarizing layer ICP may be an in-cell polarizer. The second polarizing layer ICP may be formed by applying a material containing a dichroic dye and a liquid crystal compound. In some embodiments, the second polarizing layer ICP may include a wire grid-type polarizing layer.

The color filter member CCP-1 of the optical member OPM-1 is on the second base substrate BL2. The color filter member CCP-1 may include a color conversion part CCL-1 including a plurality of color conversion parts CCL1, CCL2, and CCL3 that are spaced apart from each other on the plane. Also, the color filter member CCP-1 may further include a light blocking part BM between the first to third color conversion parts CCL1, CCL2, and CCL3.

Referring to FIGS. 8 and 9, the light blocking part BM may partition the first to third color conversion parts CCL1, CCL2, and CCL3 from each other. For example, an opening OPC may be defined in the light blocking part BM. Each of the first to third color conversion parts CCL1, CCL2, and CCL3 may be in the corresponding opening OPC. Thus, the light blocking part BM may provide a boundary between the first to third color conversion parts CCL1, CCL2, and CCL3, which are adjacent to each other.

The light blocking part BM may be a black matrix. The light blocking part BM may contain an organic light blocking material or an inorganic light blocking material including a black pigment or dye. The light blocking part BM may prevent or reduce occurrence of a light leakage phenomenon.

At least a portion of the light blocking part may be arranged to overlap the first to third color conversion parts CCL1, CCL2, and CCL3, which are adjacent to each other. For example, at least a portion of the first light blocking part BM may be arranged to overlap the first to third color conversion parts CCL1, CCL2, and CCL3, which are adjacent to each other in a thickness direction of the light blocking part BM, on a plane defined by the first direction DR1 and the third direction DR3.

The first to third color conversion parts CCL1, CCL2, and CCL3 may be arranged to be spaced apart from each other on the plane defined by the first direction DR1 and the second direction DR2. The first to third color conversion parts CCL1, CCL2, and CCL3 may be arranged to be partitioned by the light blocking part BM and be spaced apart from each other. For example, the first to third color conversion parts CCL1, CCL2, and CCL3 which are configured to emit light having different colors in the first direction DR1 may be arranged to be spaced apart from each other in parallel to each other (e.g., substantially in parallel to each other), and the color conversion parts which are configured to emit light having the same color in the second direction DR2 may be arranged to be spaced apart from each other in parallel to each other (e.g., substantially in parallel to each other). FIG. 9 illustrates an arrangement of the first to third color conversion parts CCL1, CCL2, and CCL3 according to an embodiment. However, embodiments of the present disclosure are not limited thereto. For example, the first to third color conversion parts CCL1, CCL2, and CCL3 may have areas different from each other or be aligned with a pentile structure.

According to an embodiment of the present disclosure, the color filter member CCP-1 may further include optical filter layers on the first color conversion part CCL1 and the second color conversion part CCL2.

The optical filter layers may be on the first color conversion part CCL1 and the second color conversion part CCL2 may be configured to block (or reduce transmission of) first light and transmit second and/or third light therethrough. For example, the optical filter layers may be configured to block blue light and transmit green light or red light. The optical filter layers may be on the first color conversion part CCL1 and the second color conversion part CCL2. However, embodiments of the present disclosure are not limited thereto. The color filter member CCP-1 may include an optical filter layer on the third color conversion part CCL3. The optical filter layer FP3 may be configured to transmit only the blue light.

The optical filter layers may be provided as a single layer or have a shape in which a plurality of layers are laminated. For example, the optical filter layers may be a single layer containing a material that absorbs blue light, or the optical filter layers may be a structure in which an insulation film having a low refractive index and an insulation film having a high refractive index are laminated, like the reflection layer RP.

Also, the optical filter layers may include a pigment or a dye configured to block light having a set or specific wavelength. For example, in an embodiment, each of the optical filter layers may be a yellow color filter layer configured to absorb the blue light and configured to block the blue light.

The optical filter layers may include a first optical filter layer FP1 on the first color conversion part CCL1 and a second optical filter layer FP2 on the second color conversion part CCL2. The first optical filter layer FP1 may be a filter layer configured to block the blue light and transmit the green light. Also, the second optical filter layer FP2 may be a filter layer configured to block the blue light and transmit the red light.

Referring to FIG. 10A, a color conversion part CCL-1 includes the first to third color conversion parts CCL1, CCL2, and CCL3 may be on the second base substrate BL2. The first to third color conversion parts CCL1, CCL2, and CCL3 may be provided to be patterned on one surface of the second base substrate BL2. The first to third color conversion parts CCL1, CCL2, and CCL3 may be on a bottom surface of the second base substrate BL2.

The color filter member CCP-1 according to an embodiment may include a first conversion material QD1 that absorbs the first light to wavelength-convert the first light into second light and a second conversion material QD2 that absorbs the first light to wavelength-convert the first light into third light. For example, the first light may be the blue light, the second light may be the green light, and the third light may be the red light.

The descriptions of the conversion materials QD1 and QD2 contained in the color filter member CCP of FIG. 3 according to the foregoing embodiment may be equally applied to the first conversion material QD1 and the second conversion material QD2 contained in the color filter member CCP-1 according to an embodiment. For example, the first conversion material QD1 may be green quantum dots, and the second conversion material QD2 may be red quantum dots.

The color filter member CCP-1 may include a first color conversion part CCL1 including the first conversion material QD1, a second color conversion part CCL2 including the second conversion material QD2, and a third color conversion part CCL3 configured to transmit the first light.

For example, the first conversion material QD1 may absorb the first light that is the blue light to emit the green light, and the second conversion material QD1 may absorb the first light that is the blue light to emit the red light. In some embodiments, the first color conversion part CCL1 may be a first emission area that emits the green light, and the second color conversion part CCL2 may be a second emission area that emits the red light.

Also, the third color conversion part CCL3 may be a portion that does not include the conversion material. The third color conversion part CCL3 may be a portion configured to transmit the first light provided from the backlight member LP. In some embodiments, the third color conversion part CCL3 may be an area configured to transmit the blue light. The third color conversion part CCL3 may be made of a polymer resin. For example, the third color conversion part CCL3 may be made of an acrylic-based resin, a urethane-based resin, a silicone-based resin, an epoxy-based resin, or the like. The third color conversion part CCL3 may be made of a transparent resin or a white resin.

According to an embodiment, a low-refractive index layer LRL-1 may be between the display panel DP and the color filter member CCP-1. The descriptions of the low-refractive index layer LRL described with reference to FIGS. 3-5B may be equally applied to the low-refractive index layer LRL-1.

For example, the low-refractive index layer LRL-1 may include a matrix part MX and a plurality of hollow particles HP1 and HP2 that are dispersed in the matrix part MX.

In the display module DD-1 according to an embodiment, the low-refractive index layer LRL-1 may be below the color filter member CCP-1 to change a traveling direction of light that is emitted from the color filter member CCP-1 to the display unit DPP-1.

For example, the low-refractive index layer LRL-1 may be below the color filter member CCP-1 to serve as a light extraction function of reflecting the light emitted from the color filter member CCP-1 again to allow the light to travel to the second base substrate BL2. Thus, the display module DD-1 according to an embodiment may be improved in durability and light efficiency.

The optical member OPM-1 according to an embodiment may further include a reflection layer RP. The reflection layer RP may be between the color filter member CCP-1 and the display panel DP. The reflection layer RP according to an embodiment may be arranged to be spaced apart from the color filter member CCP-1 with the low-refractive index layer therebetween. The reflection layer RP may be below the low-refractive index layer LRL-1 to cover the low-refractive index layer LRL-1.

The reflection layer RP may be a selective transmitting reflection layer configured to transmit the first light provided from the backlight member LP and reflect the second light and the third light, which are emitted from the color conversion parts CCL1 and CCL2 of the color filter member CCP-1 to the display panel DP, to emit the light to the second base substrate BL2. The reflection layer RP may be provided as a single layer or a laminate in which a plurality of layers are laminated.

For example, the reflection layer RP may include a plurality of insulation layers. Thus, transmission and reflection wavelength ranges of the reflection layer RP may be determined depending on the refractive index difference between the laminated layers, a thickness of each of the laminated layers, and the number of laminated layers.

The reflection layer RP according to an embodiment may include a first insulation layer and a second insulation layer, which have refractive indexes different from each other. Each of the first insulation layer and the second insulation layer may be provided in plurality that are alternately laminated. For example, a metal oxide material may be used as an insulation layer having a relatively high-refractive index. For example, the insulation layer having the high-refractive index may include at least one selected from titanium oxide (TiOx), tantalum oxide (TaOx), hafnium oxide (HfOx), and zirconium oxide (ZrOx). Also, the insulation layer having a relatively low-refractive index may include silicon oxide (SiOx) and/or silicon nitride (SiNx). Also, in an embodiment, the reflective layer RP may be formed by alternately repeatedly depositing silicon nitride (SiNx) and silicon oxide.

The optical member OPM-1 according to an embodiment of the present disclosure may include a planarization layer OC. The planarization layer OC may be arranged to cover the reflection layer RP covering the color conversion parts CCL1, CCL2, and CCL3 and an unevenness of the low-refractive index layer LRL-1.

In some embodiments, in a process of manufacturing the display module DD-1 according to an embodiment, the reflection layer RP and the low-refractive index layer LRL may be on the color conversion parts CCL1, CCL2, and CCL3 after the color conversion parts CCL1, CCL2, and CCL3 are on the second base substrate BS2. Thus, the reflection layer RP and the low-refractive index layer LRL may be arranged along the unevenness of the color conversion parts CCL1, CCL2, and CCL3 to form an unevenness corresponding to the unevenness of each of the color conversion parts CCL1, CCL2, and CCL3. The planarization layer OC may cover the unevenness of the reflection layer RP or the low-refractive index layer LRL to provide a planarized surface. The planarization layer OC may include an organic material.

Referring to FIG. 10B, a low-refractive index layer LRL-1a according to an embodiment may be arranged to be spaced apart from a color filter member CCP-1a (which includes a color conversion part CCL-1a) with the reflection layer RP therebetween. The low-refractive index layer LRL-1a may be below the reflection layer RP to cover the reflection layer RP.

Referring to FIG. 10C, a low-refractive index layer LRL-1b according to an embodiment may be arranged to be spaced apart from the reflection layer RP covering a color filter member CCP-1b (which includes a color conversion part CCL-1b) with the planarization layer OC therebetween. In this case, the low-refractive index layer LRL-1b may be below the planarization layer OC to cover the planarization layer OC.

Although the low-refractive index layer LRL is below the color filter members CCP-1, CCP-1a, and CCP-1b in the optical member OPM-1 described with reference to FIGS. 10A-10C, embodiments of the present disclosure are not limited thereto. For example, the low-refractive index layer LRL may be above the color filter members CCP-1, CCP-1a, and CCP-1b. The low-refractive index layer LRL may be above the color conversion parts CCL1, CCL2, and CCL3 to improve efficiency of the light emitted to the outside.

The display module DD-1 according to the embodiment described with reference to FIGS. 7-10C may include the low-refractive index layers LRL-1, LRL-1a, and LRL-1b having a good low-refractive index value and improved strength to improve durability of the display device DS (see FIG. 1). Also, the low-refractive index layers LRL-1, LRL-1a, and LRL-1b may be above or below the color filter members CCP-1 and CCP-1a to improve light extraction efficiency in the display module DD-1.

Figure 11:
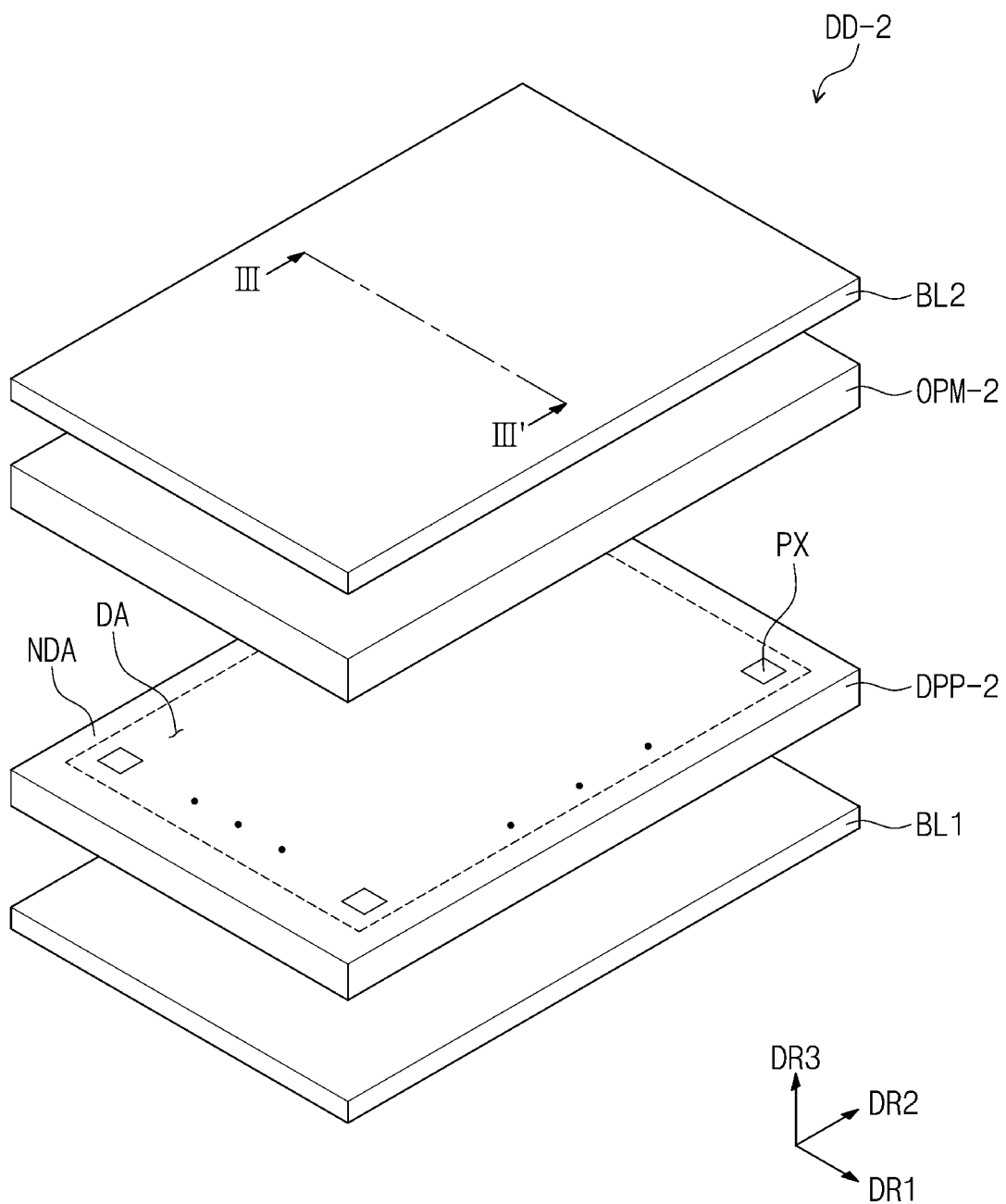
FIG. 11 is an exploded perspective view of a display device according to an embodiment of the present disclosure.
Figure 12:
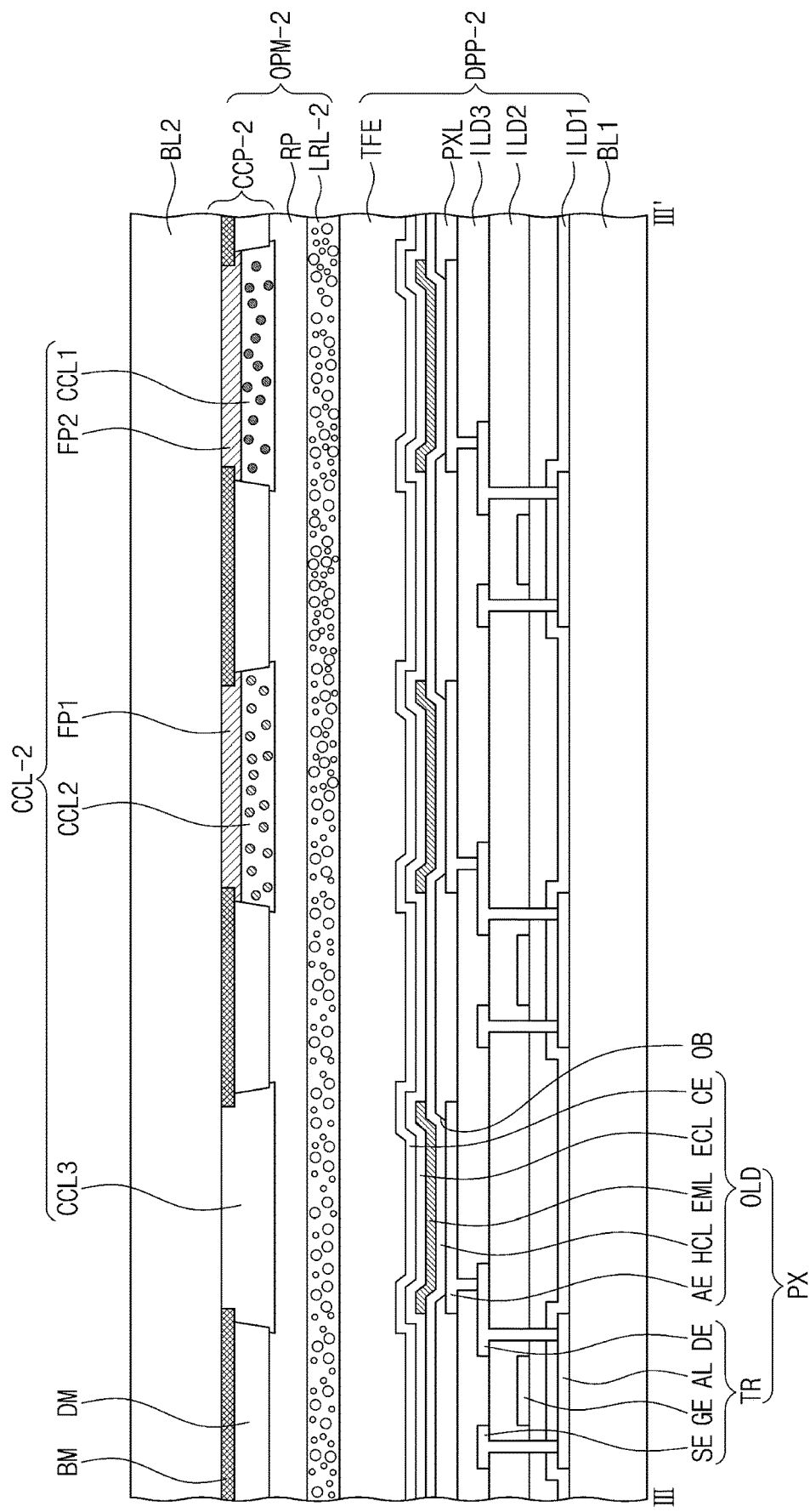
FIG. 12 is a cross-sectional view of the display device according to an embodiment of the present disclosure.
Figure 13:
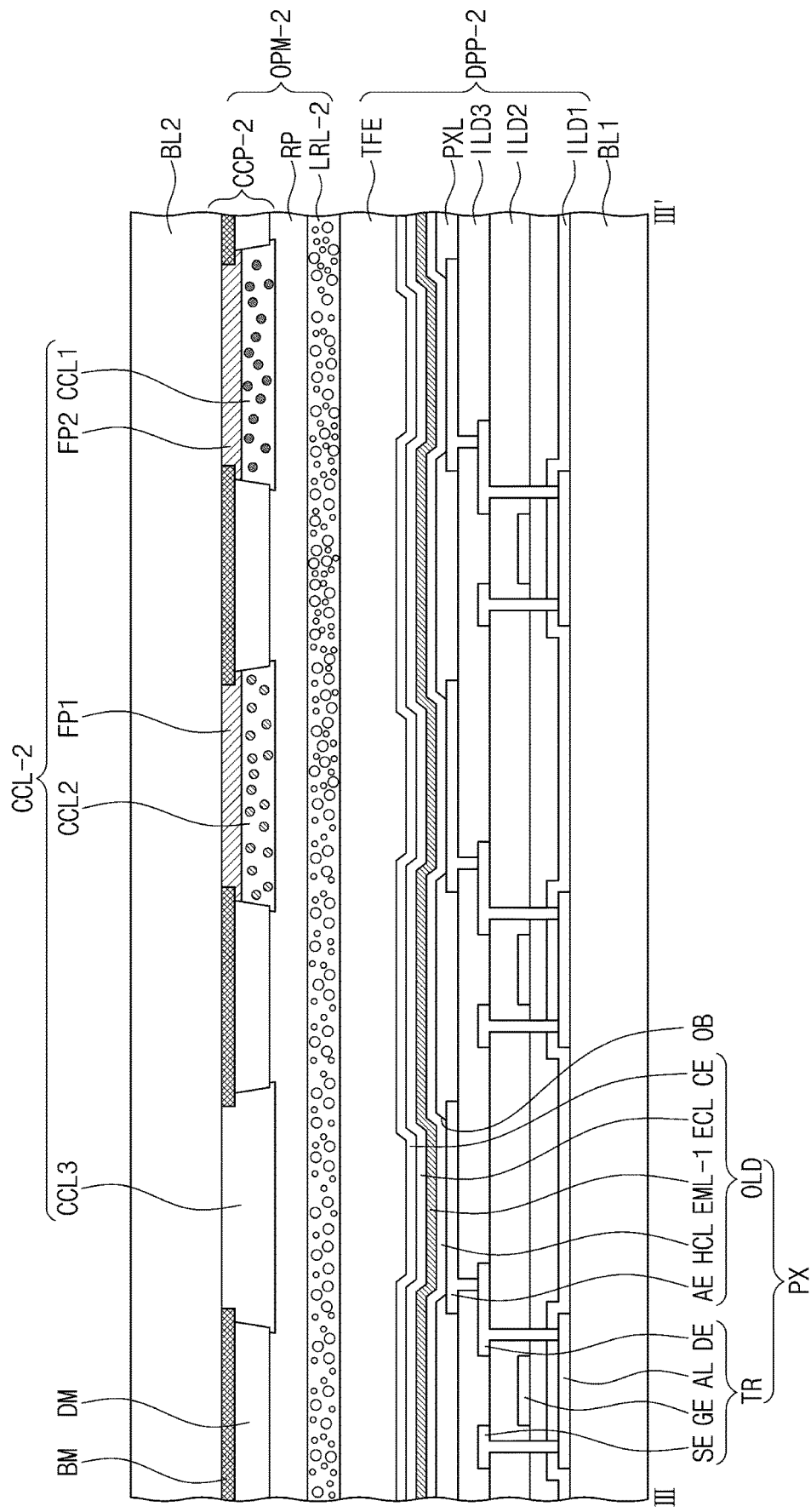
FIG. 13 is a cross-sectional view of the display device according to an embodiment of the present disclosure.

FIG. 11 is a cross-sectional view of the display device according to an embodiment of the present disclosure. FIG. 12 is a cross-sectional view illustrating a portion of constituents of the display device according to an embodiment of the present disclosure. FIG. 13 is a cross-sectional view of the display device according to an embodiment of the present disclosure. The same reference numerals are used for the same components as that of FIGS. 1-5B, and thus, duplicative descriptions thereof will not be repeated here.

Referring to FIG. 11, a display module DD-2 according to an embodiment includes a first base substrate BL1, a display unit DPP-2, an optical member OPM-2, and a second base substrate BL2.

According to an embodiment of the present disclosure, the optical member OPM-2 may include a low-refractive index layer LRL-2, a reflection layer RP, and a color filter member CCP-2 (which includes a color conversion part CCL-2).

The display unit DPP-2 may include an organic light emitting display element. For example, a pixel provided in the display unit DPP-2 may include a transistor TR on the first base substrate BL1 and an organic light emitting element OLD coupled to the transistor TR.

The transistor TR includes a semiconductor pattern AL, a control electrode GE, an input electrode SE, and an output electrode DE.

The semiconductor pattern AL of the thin film transistor TR and the first insulation layer ILD1 are on the first base substrate BL1. The first insulation layer ILD1 covers the semiconductor pattern AL.

The control electrode GE and the second insulation layer ILD2 are on the first insulation layer ILD1. The second insulation layer ILD2 covers the control electrode GE. Each of the first insulation layer ILD1 and the second insulation layer ILD2 include an organic and/or inorganic layer. Each of the first insulation layer ILD1 and the second insulation layer ILD2 may include a plurality of thin films.

The input electrode SE, the output electrode DE, and the third insulation layer ILD3 are on the second insulation layer ILD2. The third insulation layer ILD3 covers the input electrode SE and the output electrode DE.

The input electrode SE and the output electrode DE are coupled to the semiconductor pattern AL through a first through-hole CH1 and a second through-hole CH2, which are defined in the first insulation layer ILD1 and the second insulation layer ILD2, respectively.

An organic light emitting element OLD and a pixel defining layer PXL are on the third insulation layer ILD3. The organic light emitting element OLD includes an anode electrode AE, a light emitting layer EML, a cathode electrode CE, a hole transport hole region HCL defined between the anode electrode AE and the light emitting layer EML, and an electron transport region defined between the cathode electrode CE and the light emitting layer EML.

The anode electrode AE is coupled to the output electrode DE through the through-hole defined in the third insulation layer ILD3.

The pixel defining layer PXL is on the third insulation layer ILD3. An opening OB through which at least a portion of the anode electrode AE is exposed may be defined in the pixel defining layer PXL. An area on which the anode electrode AE is located may correspond to the emission area of the light emitted from the organic light emitting element OLD. In another embodiment of the present disclosure, an area in which the opening OB is defined may correspond to the emission area.

The hole transport region HCL may be defined above the anode electrode AE to cover the anode electrode AE and the pixel defining layer PXL. The hole transport region HCL may include at least one of a hole injection layer, a hole transport layer, or a single layer having a hole injection function and a hole transport function.

The light emitting layer EML may be on the hole transport region HCL. The light emitting layer EML may overlap the opening OB defined in the pixel defining layer PXL. Thus, the light emitting layer EML according to an embodiment may be provided in plurality and patterned to overlap the opening OB. The light emitting layer EML may include a fluorescent material, a phosphorescent material, and/or a quantum dot. The light emitting layer EML may generate light having one color or generate light in which at least two colors are mixed with each other. The emission area according to embodiments of the present disclosure may overlap the light emitting layer EML on the plane.

The electron transport region ECL may be on the light emitting layer EML to cover the light emitting layer EML and the hole transport region HCL. The electron transport region ECL may include at least one selected from an electron transport material and an electron injection material. The electron transport region ECL may be an electron transport layer comprising an electron transport material or be an electron injection/transport single layer including an electron transport material and an electron injection material.

The cathode electrode CE may be on the electron transport region ECL to face the anode electrode AE. The cathode electrode CE may be made of a material having a low work function to facilitate the electron injection.

An encapsulation layer TFE is on the cathode electrode CE. The encapsulation layer TFE covers an entire (e.g., substantially the entire) surface of the cathode electrode CE to seal the organic light emitting element OLD. The encapsulation layer TFE protects the organic light emitting element OLD from moisture and foreign substances. The encapsulation layer TFE may be a layer formed by deposition.

The encapsulation layer may include an inorganic layer and/or an organic layer. The inorganic layer may include, for example, at least one selected from aluminum oxide (AlOx), silicon oxide (SiOx), silicon nitride (SiNx), silicon oxynitride (SiOxNy), silicon carbide (SiCx), titanium oxide (TiOx), zirconium oxide (ZrOx), and zinc oxide (ZnOx).

The organic layer may include, for example, at least one selected from epoxy, polyimide (PI), polyethylene terephthalate (PET), polycarbonate (PC), polyethylene (PE), and polyacrylate. The inorganic layer according to an embodiment may be provided in plurality. The inorganic layers may be arranged with the organic layer therebetween to cover the organic layer.

According to an embodiment, the color filter member CCP-2 of the optical member OPM-2 is on the second base substrate BL2. The color filter member CCP-2 may further include a light blocking part BM, an optical filter layer FP, and a dam part DM.

The color filter member CCP-2 may include first to third color conversion parts CCL1, CCL2, and CCL3. The descriptions of the first to third color conversion parts CCL1, CCL2, and CCL3, the light blocking part BM, the conversion materials QD1 and QD2, which are provided in the optical member OPM-1 described with reference to FIGS. 7-10C according to an embodiment may be equally applied to the first to third color conversion parts CCL1, CCL2, and CCL3 and the light blocking part BM. Each of the first to third color conversion parts CCL1, CCL2, and CCL3 according to an embodiment may be arranged to overlap the corresponding light emitting layer EML. Thus, each of the color conversion parts CCL1, CCL2, and CCL3 may be arranged to overlap the emission area overlapping the light emitting layer EML.

The color filter member CCP-2 may include a first conversion material QD1 configured to absorb the first light to wavelength-convert the first light into second light and a second conversion material QD2 configured to absorb the first light to wavelength-convert the first light into third light. Also, the color filter member CCP-2 may include a first color conversion part CCL1 including the first conversion material QD1, a second color conversion part CCL2 including the second conversion material QD2, and a third color conversion part CCL3 that configured to transmit the first color light.

The dam part BM may be arranged to overlap the light blocking part BM. The dam part DM may be between the first to third color conversion parts CCL1, CCL2, and CCL3. The dam part DM may be arranged so as not to overlap the emission area overlapping the light emitting layer EML.

Thus, the first to third color conversion parts CCL1, CCL2, and CCL3 may be partitioned by the dam part DM to overlap the emission area.

The dam part DM may be made of a polymer resin. For example, the dam part DM may be formed by patterning an acrylic-based resin, an imide-based resin, or the like. The dam part DM may partition the first to third color conversion parts CCL1, CCL2, and CCL3, which are adjacent to each other.

According to an embodiment of the present disclosure, the color filter member CCP-2 may further include optical filter layers on the first color conversion part CCL1 and the second color conversion part CCL2.

The optical filter layers may be on the first color conversion part CCL1 and the second color conversion part CCL2 to block (or reduce transmission of) first light and transmit second and/or third light therethrough. For example, the optical filter layers may be configured to block blue light and transmit green light or red light. However, embodiments of the present disclosure are not limited thereto. The color filter member CCP-1 may include an optical filter layer on the third color conversion part CCL3. The optical filter layer FP3 may be configured to transmit only the blue light.

In an embodiment of FIG. 12, a reflection layer RP may be between the low-refractive index layer LRL-2 and the color filter member CCP-2. The descriptions of the reflection layer RP provided in the optical member OPM-1 described with reference to FIGS. 10A-10C may be equally applied to the reflection layer RP.

For example, the reflection layer RP below the color filter member CCP-2 according to an embodiment may be configured to transmit first light provided from the display unit DPP-2 and reflect second light and third light. The reflection layer RP may be a selective transmission-reflection layer.

Unlike FIG. 12, the low-refractive index layer LRL-2 may be directly on a lower portion of each of the color conversion parts CCL1, CCL2, and CCL3. For example, the low-refractive index layer LRL-2 may be between the reflection layer RP and the color conversion parts CCL1, CCL2, and CCL3, but embodiments of the present disclosure are not limited thereto.

Referring to FIG. 13, unlike the light emitting layer EML of FIG. 12, the light emitting layer EML-1 according to an embodiment may be arranged as a common layer. For example, the light emitting layer EML-1 may be arranged to cover an entire (e.g., substantially the entire) surface of the hole transport region HCL. According to embodiments of the present disclosure, light provided from the display unit DDP-2 to the optical member OPM-2 may be blue light. Thus, the pixels PX have light having the same color. As a result, the light emitting layer EML-1 may be arranged as the common layer on the hole transport region HCL without a separate patterning process.

In the display module DD-2 described with reference to FIGS. 11-13, the low-refractive index layer LRL-2 having a good refractive index value and the improved strength may be provided to improve the durability of the display device DS (see FIG. 1). Also, the low-refractive index layer LRL-2 may be above or below the color filter members CCP-1 and CCP-1a to improve light extraction efficiency in the display module DD-1.

The display device according to some embodiments may include the low-refractive index layer containing the hollow particles having different sizes (e.g., different particle sizes) to provide good reliability while maintaining a low-refractive index.

The display device according to some embodiments may include the low-refractive index layer having a good refractive index and high strength to improve the light efficiency and color reproducibility, thereby improving the display quality.

It will be apparent to those skilled in the art that various modifications and variations can be made to the subject matter of the present disclosure. Thus, it is intended that the present disclosure covers the modifications and variations of subject matter disclosed herein provided that they come within the scope of the appended claims and their equivalents.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hence, the real protective scope of the present disclosure shall be determined by the technical scope of the accompanying claims, and equivalents thereof.

What is claimed is:

1. An optical member comprising:
   a color filter member comprising quantum dots; and
   a low-refractive index layer below the color filter member and comprising a matrix part, and embedded together with each other in the matrix part a first hollow particle and a second hollow particle,
   wherein the first hollow particle has a particle size different from a particle size of the second hollow particle,
   wherein the first hollow particle is present in the low-refractive index layer in an amount in a range of about 40 wt % to about 60 wt %, based on the total weight of the low-refractive index layer, and
   wherein the second hollow particle is present in the low-refractive index layer in an amount in a range of about 15 wt % to about 35 wt %, based on the total weight of the low-refractive index layer,
   wherein a sum of the total weight of the first hollow particle and the second hollow particle is 75% in the low-refractive index layer and the remaining 25% in the low-refractive index layer is a weight of the matrix part.

2. The optical member of claim 1, wherein the first hollow particle has a diameter in a range of about 80 nm to about 120 nm, and the second hollow particle has a diameter in a range of about 30 nm to about 70 nm.

3. The optical member of claim 1, wherein the low-refractive index layer has a refractive index in a range of about 1 to about 1.2.

4. The optical member of claim 1, wherein each of the first hollow particle and the second hollow particle comprises a core part comprising air and a shell part surrounding the core part.

5. The optical member of claim 4, wherein each of the first hollow particle and the second hollow particle has a spherical shape.

6. An optical member comprising:

a matrix part; and a low-refractive index layer comprising a plurality of hollow particles that are dispersed in the matrix part, wherein the hollow particles comprise a first hollow particle and a second hollow particle, wherein the first hollow particle is present in the low-refractive index layer in an amount in a range of about 40 wt % to about 60 wt %, based on the total weight of the low-refractive index layer, and wherein the second hollow particle is present in the low-refractive index layer in an amount in a range of about 15 wt % to about 35 wt %, based on the total weight of the low-refractive index layer, wherein a sum of the total weight of the first hollow particle and the second hollow particle is 75% in the low-refractive index layer and the remaining 25% in the low-refractive index layer is a weight of the matrix part.

7. The optical member of claim 6, wherein the first hollow particle has a diameter greater than a diameter of the second hollow particle.

8. The optical member of claim 7, wherein the diameter of the first hollow particle in a range of about 80 nm to about 120 nm, and wherein diameter of the second hollow particle is in a range of about 30 nm to about 70 nm.

9. The optical member of claim 6, wherein each of the first hollow particle and the second hollow particle comprises a core part comprising air and a shell part surrounding the core part.

* * * * *